US008103932B2

(12) United States Patent
Lee et al.

(10) Patent No.: US 8,103,932 B2

(45) Date of Patent: Jan. 24, 2012

(54) DTV TRANSMITTING SYSTEM AND RECEIVING SYSTEM AND METHOD OF PROCESSING BROADCAST DATA

(75) Inventors: Hyoung Gon Lee, Seoul (KR); In Hwan Choi, Gyeonggi-do (KR); Byoung Gill Kim, Seoul (KR); Won Gyu Song, Seoul (KR); Jong Moon Kim, Gyeonggi-do (KR); Jin Woo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/194,829

(22) Filed: Jul. 29, 2011

(65) Prior Publication Data

US 2011/0285914 A1 Nov. 24, 2011

Related U.S. Application Data

(63) Continuation of application No. 13/011,750, filed on Jan. 21, 2011, now Pat. No. 8,020,066, which is a continuation of application No. 11/752,859, filed on May 23, 2007, now Pat. No. 7,904,785.

(60) Provisional application No. 60/883,994, filed on Jan. 8, 2007.

(30) Foreign Application Priority Data

May 23, 2006 (KR) ........................ 10-2006-0046295
Sep. 15, 2006 (KR) ........................ 10-2006-0089736

(51) Int. Cl.
*H03M 13/00* (2006.01)

(52) U.S. Cl. ........................................................ 714/755

(58) Field of Classification Search .................. 714/752, 714/755, 758, 784, 786, 792; 375/262, 341; 370/312, 478

See application file for complete search history.

(56) References Cited

U.S. PATENT DOCUMENTS

| | | | |
|---|---|---|---|
| 5,867,503 | A | 2/1999 | Ohsuga |
| 6,980,603 | B2 | 12/2005 | Choi et al. |
| 7,480,851 | B2 | 1/2009 | Chang et al. |
| 2002/0154709 | A1 | 10/2002 | Choi et al. |
| 2008/0031349 | A1 | 2/2008 | Lee et al. |

FOREIGN PATENT DOCUMENTS

| | | |
|---|---|---|
| EP | 1061746 | 12/2000 |
| WO | 2005-006759 | 1/2005 |
| WO | 2005-115001 | 12/2005 |

*Primary Examiner* — Shelly A Chase

(74) *Attorney, Agent, or Firm* — Lee, Hong, Degerman, Kang & Waimey

(57) ABSTRACT

A DTV transmitting system includes a frame encoder, a randomizer, a block processor, a group formatter, a deinterleaver, and a packet formatter. The frame encoder builds an enhanced data frame and encodes the frame two times for first and second error correction, respectively. It further permutes a plurality of encoded data frames. The randomizer randomizes the permuted enhanced data, and the block processor codes the randomized data at a rate of 1/N1. The group formatter forms a group of enhanced data having one or more data regions and inserts the data coded at the rate of 1/N1 into at least one of the data regions. The deinterleaver deinterleaves the group of enhanced data, and the packet formatter formats the deinterleaved data into enhanced data packets.

16 Claims, 16 Drawing Sheets

Input Data
801
Demodulator
802
Equalizer
803
Known Sequence Detector
804
Block Decoder
805
Data Deformatter
806
RS Frame Decoder
Enhanced Data
807
Data Deinterleaver
808
RS Decoder
809
Data Derandomizer
Main Data

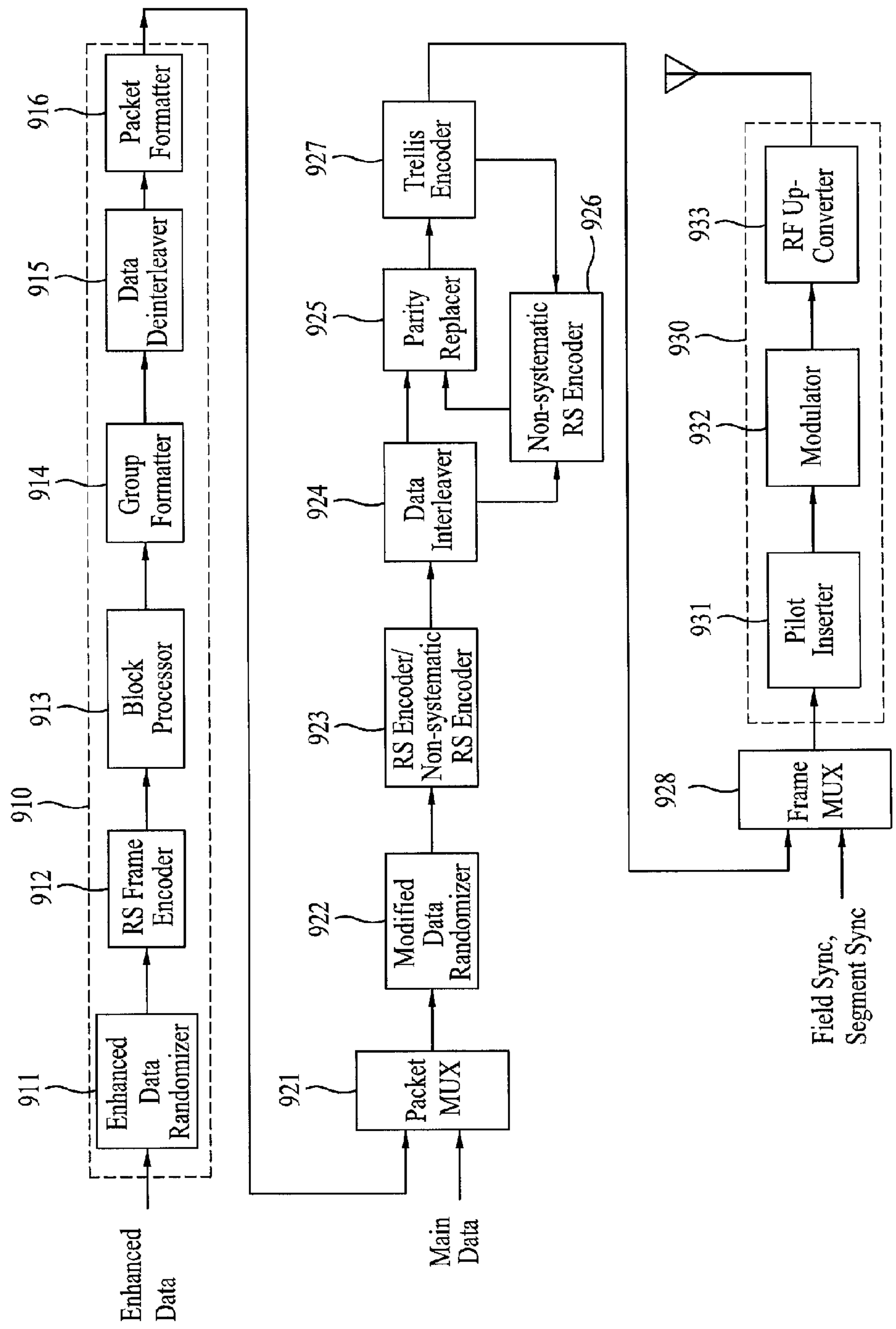
FIG. 11
Enhanced Data
911
Enhanced Data Randomizer
912
RS Frame Encoder
910
913
Block Processor
914
Group Formatter
915
Data Deinterleaver
916
Packet Formatter
Main Data
921
Packet MUX
922
Modified Data Randomizer
923
RS Encoder/ Non-systematic RS Encoder
924
Data Interleaver
925
Parity Replacer
926
Non-systematic RS Encoder
927
Trellis Encoder
Field Sync, Segment Sync
928
Frame MUX
931
Pilot Inserter
932
Modulator
930
933
RF Up-Converter Input Data
Demodulator
1001
Equalizer
1002
Known Sequence Detector
1003
Block Decoder
1004
Enhanced Data Deformatter
1005
RS Frame Decoder
1006
Enhanced Data Derandomizer
1007
Enhanced Data
Data Deinterleaver
1008
RS Decoder
1009
Main Data Derandomizer
1010
Main Data

DTV TRANSMITTING SYSTEM AND RECEIVING SYSTEM AND METHOD OF PROCESSING BROADCAST DATA

CROSS-REFERENCE TO RELATED APPLICATIONS

This application is a continuation of U.S. application Ser. No. 13/011,750, filed on Jan. 21, 2011 (and issued as U.S. Pat. No. 8,020,066on Sep. 13, 2011), which is a continuation of U.S. application Ser. No. 11/752,859, filed on May 23, 2007 (and issued as U.S. Pat. No. 7,904,785 on Mar. 8, 2011), which claims the benefit of and right of priority to the Korean Patent Application No. 10-2006-0046295, filed on May 23, 2006, the Korean Patent Application No. 10-2006-0089736, filed on Sep. 15, 2006, and U.S. Provisional Application No. 60/883,994, filed on Jan. 8, 2007, the contents of all of which are hereby incorporated by reference in their entireties.

BACKGROUND OF THE INVENTION

1. Field of the Invention

The present invention relates to digital television (DTV) systems and methods of processing broadcast data.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receiving systems.

SUMMARY OF THE INVENTION

Accordingly, the present invention is directed to a digital television (DTV) transmitting system and a DTV receiving system and a method of processing broadcast data that substantially obviate one or more problems due to limitations and disadvantages of the related art.

An object of the present invention is to provide a DTV transmitting system and a DTV receiving system and a method of processing broadcast data is suitable for transmitting supplemental data and that is highly resistant to noise.

Another object of the present invention is to provide a DTV transmitting system and a DTV receiving system and a method of processing broadcast data that can perform additional encoding on enhanced data and transmitting the processed enhanced data, thereby enhancing the performance of the receiving system.

A further object of the present invention is to provide a DTV transmitting system and a DTV receiving system and a method of processing broadcast data that can multiplex known data that are already known by a receiving system and/or a transmitting system and enhanced data with main data, and transmit the multiplexed data, thereby enhancing the performance of the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes a frame encoder, a randomizer, a block processor, a group formatter, a deinterleaver, and a packet formatter. The frame encoder initially builds an enhanced data frame and encodes the enhanced data frame two times for first and second error correction, respectively. For example, the frame encoder may encode the enhanced data frame row by row for the first error correction, and may further encode the coded enhanced data frame column by column for the second error correction. Alternatively, it may encode the enhanced data frame column by column first and may encode the frame row by row next. Thereafter, the frame encoder forms a group of encoded enhanced data frames and permutes the plurality of encoded enhanced data frames. The randomizer randomizes the permuted enhanced data, and the block processor codes the randomized enhanced data at an effective coding rate of 1/N1. The group formatter forms a group of enhanced data having one or more data regions and inserts the enhanced data which are coded at the effective rate of 1/N1 into at least one of the data regions. The deinterleaver deinterleaver the group of enhanced data, and the packet formatter formats the deinterleaved enhanced data into enhanced data packets.

In another aspect of the present invention, a digital television (DTV) transmitting system includes a frame encoder, a data randomizing and expanding unit, a group formatter, a block processor, a deinterleaver, and a packet formatter. The frame encoder builds an enhanced data frame and encodes the data frame two times for first and second error correction, respectively. Thereafter, the frame encoder forms a group of encoded enhanced data frames and permutes the plurality of encoded enhanced data frames. The data randomizing and expanding unit randomizes the permuted enhanced data and expands the randomized enhanced data at an expansion rate of 1/N1. The group formatter forms a group of enhanced data having one or more data regions and inserts the expanded enhanced data into at least one of the data regions. The block processor codes the group of enhanced data at a coding rate of 1/N1, and the deinterleaver deinterleaves the enhanced data which are coded at the coding rate of 1/N1. The packet formatter formats the deinterleaved enhanced data into enhanced data packets.

In another aspect of the present invention, a digital television (DTV) transmitting system includes a frame encoder, a data randomizing and expanding unit, a group formatter, a deinterleaver, and a packet formatter. The frame encoder builds an enhanced data frame and encodes the data frame two times for first and second error correction, respectively. Thereafter, the frame encoder forms a group of encoded enhanced data frames and permutes the plurality of encoded enhanced data frames. The data randomizing and expanding unit randomizes the permuted enhanced data and expands the randomized enhanced data at an expansion rate of 1/N1. The group formatter forms a group of enhanced data having one or more data regions and inserts the expanded enhanced data into at least one of the data regions. The deinterleaver deinterleaves the group of enhanced data, and the packet formatter formats the deinterleaved enhanced data into enhanced data packets. The DTV transmitting system may further includes a bock processor which codes the enhanced data packets at a coding rate of 1/N1.

In another aspect of the present invention, a digital television (DTV) receiving system includes a tuner, a demodulator, an equalizer, a block decoder, a data deformatter, and a frame decoder. The tuner tunes to a channel to receive a digital broadcast signal including enhanced and main data The demodulator demodulates the digital broadcast signal, and the equalizer compensates channel distortion of the demodulated signal. The block decoder decodes each bock of enhanced data in the channel-equalized signal. The data deformatter deformats the decoded enhanced data, removes null data from the deformatted enhanced data, and derandomizes the null-data-removed enhanced data. The frame decoder forms a plurality of enhanced data frames including the derandomized enhanced data, performs reverse permutation on the plurality of enhanced data frames, and decodes the permuted enhanced data frames two times for first and second error correction, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 11 illustrates a block diagram of a digital broadcast (or television or DTV) transmitting system according to another embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather forecast, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. By performing additional encoding on the enhanced data and by transmitting the processed data, the present invention may provide robustness to the enhanced data thereby enabling the data to respond more effectively to the channel environment that undergoes frequent changes. For example, the present invention may perform primary error correction encoding on the enhanced data in any one of a row direction and a column direction. Subsequently, secondary error correction encoding is performed the primarily error correction coded enhanced data in the other direction. This processed will hereinafter be referred to as a double error correction encoding for simplicity. At this point, a permutation process of the coded data to equal sizes may be additionally performed.

Figure 1:
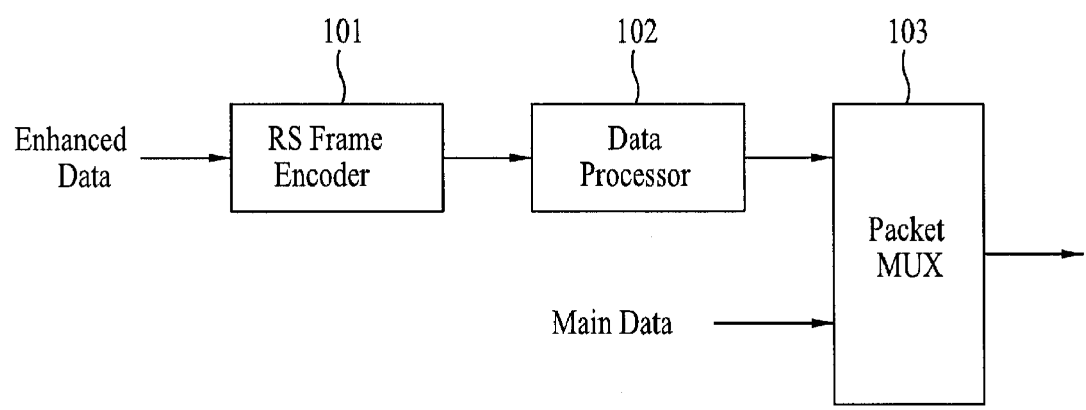
FIG. 1 illustrates a general diagram of a digital broadcast transmitting system according to the present invention.

FIG. 1 illustrates a block diagram showing a unit of a digital broadcast transmitting system for performing the error correction encoding process according to the present invention. The unit includes a RS frame encoder 101, a data processor 102, and a packet multiplexer 103. In the above-described structure of the present invention, the main data are inputted to the packet multiplexer 103, and the enhanced data are inputted to the RS frame encoder 101. Herein, additional encoding processes are performed on the enhanced data, thereby providing robustness to the enhanced data, so that the enhanced data can respond effectively and instantly to the noise and change in channel. The RS frame encoder 101 receives the enhanced data and configures frames for the additional encoding processes.

Then, the RS frame encoder 101 performs primary and secondary error correction encoding processes, thereby outputting the processed data to the data processor 102. The data processor 102 performs additional processes on the error correction coded enhanced data and, then, outputs the processed data to the packet multiplexer 103 in a MPEG TS packet format (i.e., enhanced data packets) of 188-byte units. The operations of the data processor 102 will be described in detail in a later process. The enhanced data packet and the main data packet being inputted to the packet multiplexer 103 are multiplexed and outputted in accordance with a pre-defined multiplexing method.

The operations of the RS frame encoder 101 will now be described in detail. According to a first embodiment of the present invention, the RS frame encoder 101 performs a primary error correction encoding process on the received enhanced data in a row direction. Thereafter, the RS frame encoder 101 performs a secondary error correction encoding process on the primarily error correction coded enhanced data in a column direction, thereby providing robustness to the enhanced data. According to a second embodiment of the present invention, the RS frame encoder 101 performs a primary error correction encoding process on the received enhanced data in a column direction. Thereafter, the RS frame encoder 101 performs a secondary error correction encoding process on the primarily error correction coded enhanced data in a row direction, thereby providing robustness to the enhanced data. Furthermore, the present invention may also include a process of permuting enhanced data in equal sizes so as to scatter group error that may occur during changes in a frequency environment, thereby enabling the enhanced data to respond to the frequency environment, which is extremely vulnerable and liable to frequent changes.

First Embodiment

Figure 2:
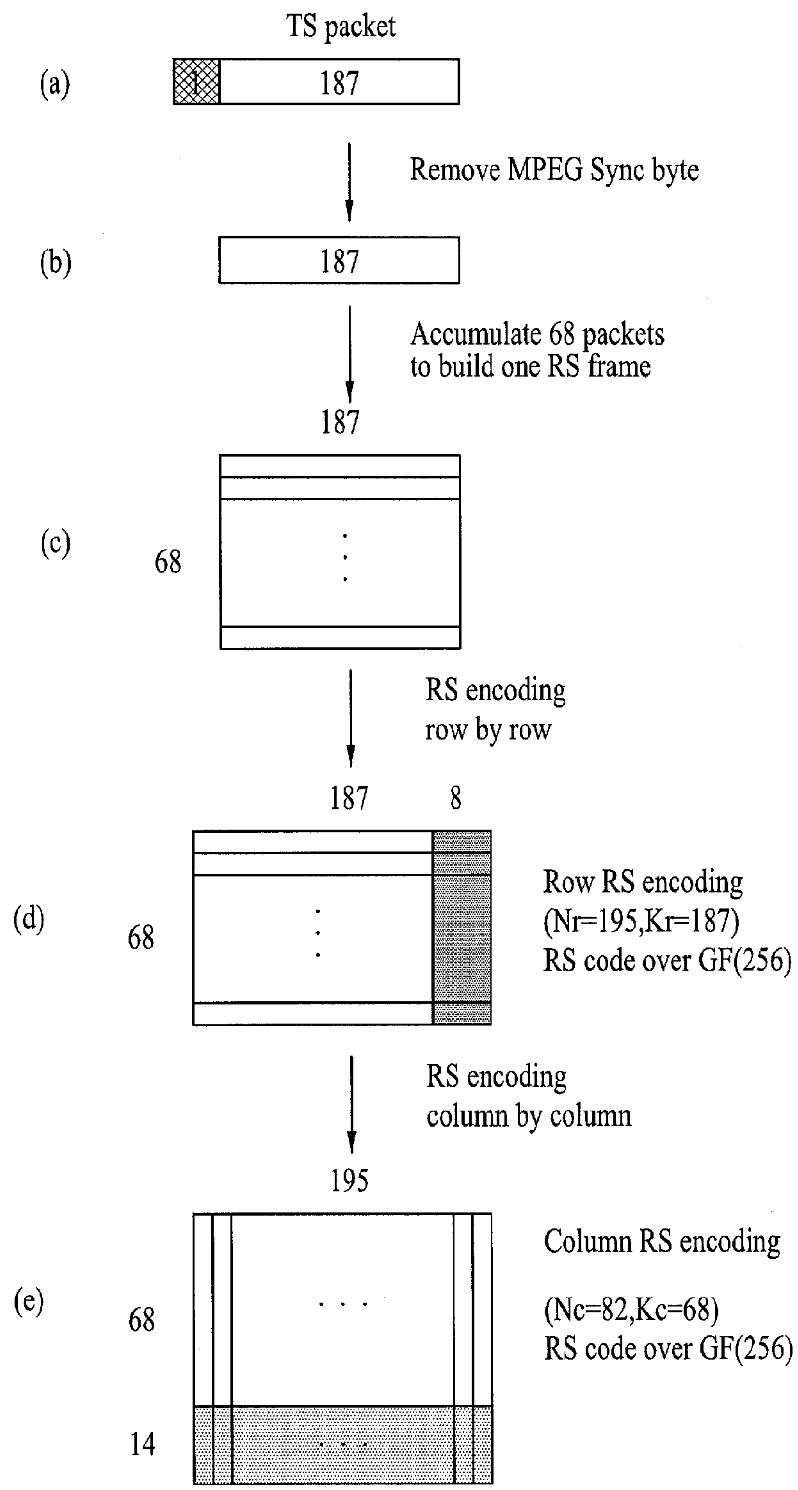
FIG. 2(*a*) to FIG. 2(*e*) illustrate examples showing the steps of a double error correction coding process according to an embodiment of the present invention.

FIG. 2(*a*) to FIG. 2(*e*) illustrate examples showing the steps of a double error correction encoding process according to a first embodiment of the present invention. In this embodiment, the inputted enhanced data are divided into units of an equal length A. A plurality of A-length enhanced data units is grouped to configure a frame. Then, a primary error correction encoding process is performed on the configured frame in a row direction, thereby adding parity data to the primarily error correction coded enhanced data in a row direction. Subsequently, a secondary error correction encoding process is performed in a column direction on the enhanced data having parity data added thereto in a row direction, thereby adding parity data to the secondarily error correction coded enhanced data in a column direction.

In the present invention, the particular length A will be referred to as the row for simplicity. Herein, the value A will be decided by the system designer. Additionally, in this example, the error correction encoding process adopts the RS encoding process. For example, if the inputted enhanced data correspond to a MPEG transport stream (TS) packet configured of 188-byte units, the first MPEG synchronization byte is removed, as shown in FIG. 2(*a*), thereby configuring a 187-byte row A, as shown in FIG. 2(*b*). Herein, the first MPEG synchronization byte is removed because each of enhanced data packets has the same value. If a fixed byte that can be removed is not included in the inputted enhanced data, or if the length of the inputted packet is not 187 bytes, the input data are divided into 187-byte units, thereby configuring a row A divided into 187 bytes. In a row A is decided in accordance with the above-described process, a plurality of rows (A's) is grouped to form a RS frame. As shown in FIG. 2(*c*), in the first embodiment of the present invention, 68 rows are grouped to form a single RS frame.

A (Nr,Kr)-RS encoding process is performed on each of the 68 rows in the RS frame so as to generate Nr-Kr number of parity bytes. Then, the generated Nr-Kr number of parity bytes are added at the end portion of each corresponding row (i.e., after the $187^{th}$ column of each corresponding row). In this example, Nr is equal to 195, and Kr is equal to 187 (i.e., Nr=195 and Kr=187). Accordingly, the parity data being added to each row, as shown in FIG. 2(*d*), correspond to 8 bytes. In other words, one row is being expanded from 187 bytes to 195 bytes. As described above, when the (195,187)-RS encoding process is performed on each of the 68 rows within the RS frame, a first RS frame includes 195 bytes in each row and 68 bytes in each column. In other words, the first RS frame includes 68 rows (or packets) each configured of 195 bytes.

Subsequently, a (Nc,Kc)-RS encoding process is performed on each column in the RS frame, which is RS-encoded in the row direction as shown in FIG. 2(*d*), so as to generate Nc-Kc number of parity bytes. Then, the generated Nc-Kc number of parity bytes are added at the end portion of each corresponding column (i.e., after the $68^{th}$ row of each corresponding column). In this example, Nc is equal to 82, and Kc is equal to 68 (i.e., Nc=82 and Kc=68). Accordingly, the parity data being added to each column, as shown in FIG. 2(*e*), correspond to 14 bytes. In other words, one column is being expanded from 68 bytes to 82 bytes. As described above, when the (82,68)-RS encoding process is performed on each of the 195 columns within the RS frame, a second RS frame includes 195 bytes in each row and 82 bytes in each column. In other words, the first RS frame includes 82 rows each configured of 195 bytes.

Second Embodiment

Figure 3:
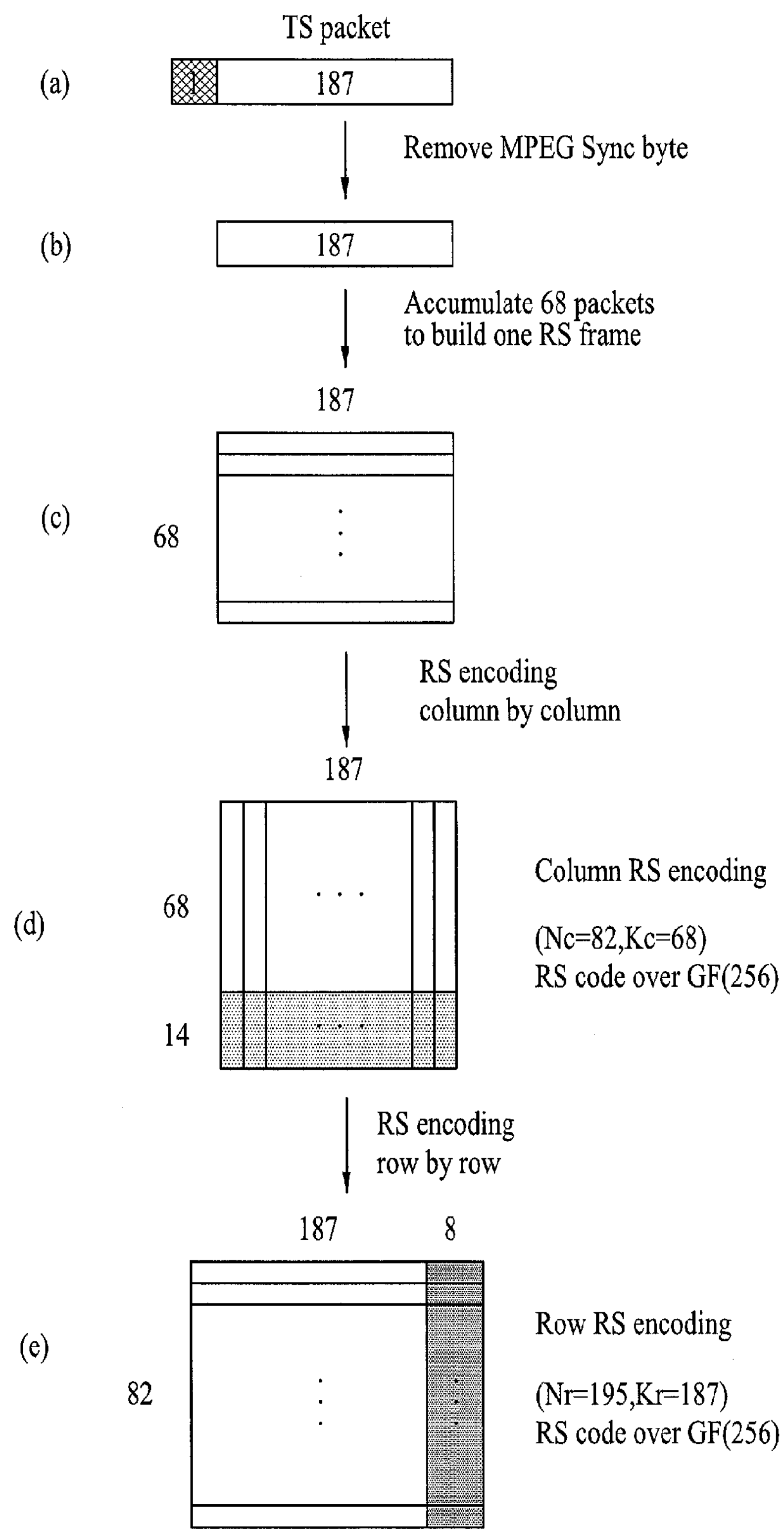
FIG. 3(*a*) to FIG. 3(*e*) illustrate examples showing the steps of a double error correction encoding process according to another embodiment of the present invention.

FIG. 3(*a*) to FIG. 3(*e*) illustrate examples showing the steps of a double error correction encoding process according to a second embodiment of the present invention. Apart from performing a primary error correction encoding process is a column direction and performing a secondary error correction encoding process is a row direction, the second embodiment of the present invention may be applied identically as the first embodiment of the present invention. More specifically, in this embodiment, the inputted enhanced data are divided into units of an equal length A. A plurality of A-length enhanced data units is grouped to configure a frame. Then, a primary error correction encoding process is performed on the configured frame in a column direction, thereby adding parity data to the primarily error correction coded enhanced data in a column direction. Subsequently, a secondary error correction encoding process is performed in a row direction on the enhanced data having parity data added thereto in a column direction, thereby adding parity data to the secondarily error correction coded enhanced data in a row direction.

In the present invention, the particular length A will be referred to as the row for simplicity. Herein, the value A will be decided by the system designer. Additionally, in this example, the error correction encoding process adopts the RS encoding process. For example, if the inputted enhanced data correspond to a MPEG transport stream (TS) packet configured of 188-byte units, the first MPEG synchronization byte is removed, as shown in FIG. 3(*a*), thereby configuring a 187-byte row A, as shown in FIG. 3(*b*), Herein, the first MPEG synchronization byte is removed because each of enhanced data packets has the same value. If a fixed byte that can be removed is not included in the inputted enhanced data, or if the length of the inputted packet is not 187 bytes, the input data are divided into 187-byte units, thereby configuring a row A divided into 187 bytes. In a row A is decided in accordance with the above-described process, a plurality of rows (A's) is grouped to form a RS frame. As shown in FIG. 3(*c*), in the first embodiment of the present invention, 68 rows are grouped to form a single RS frame.

A (Nc,Kc)-RS encoding process is performed on each column in the RS frame so as to generate Nc-Kc number of parity bytes. Then, the generated Nc-Kc number of parity bytes are added at the end portion of each corresponding column (i.e., after the $68^{th}$ row of each corresponding column). In this example, Nc is equal to 82, and Kc is equal to 68 (i.e., Nc=82 and Kc=68). Accordingly, the parity data being added to each column, as shown in FIG. 3(*d*), correspond to 14 bytes. When the (82,68)-RS encoding process is performed on each of the 187 columns within the RS frame, a first RS frame includes 187 bytes in each row and 82 bytes in each column. In other words, the first RS frame includes 82 rows each configured of 187 bytes.

Subsequently, a (Nr,Kr)-RS encoding process is performed on each row in the RS frame, which is RS-encoded in the column direction as shown in FIG. 3(*d*), so as to generate Nr-Kr number of parity bytes. Then, the generated Nr-Kr number of parity bytes are added at the end portion of each corresponding row (i.e., after the $187^{th}$ column of each corresponding row). In this example, Nr is equal to 195, and Kr is equal to 187 (i.e., Nr=195 and Kr=187). Accordingly, the parity data being added to each row, as shown in FIG. 3(*e*), correspond to 8 bytes. When the (195,187)-RS encoding process is performed on each of the 82 rows within the RS frame, a second RS frame includes 195 bytes in each row and 82 bytes in each column. In other words, the second RS frame includes 82 rows each configured of 195 bytes.

As described above, since the number of bytes configuring each row, the number of rows configuring the RS frame, and the values of Nr, Nc, Kr, and Kc, which are used for the RS encoding process may vary depending upon the system design and any other circumstances, these details are not limited only to the examples given in the first and second embodiments of the present invention. Meanwhile, by performing row permutation on the enhanced data processed with double RS encoding, as shown in the first embodiment of FIG. 2 and in the second embodiment of FIG. 3, group error that may occur during changes in a frequency environment is scattered, thereby enabling the enhanced data to respond to the frequency environment, which is extremely vulnerable and liable to frequent changes.

Figure 4:
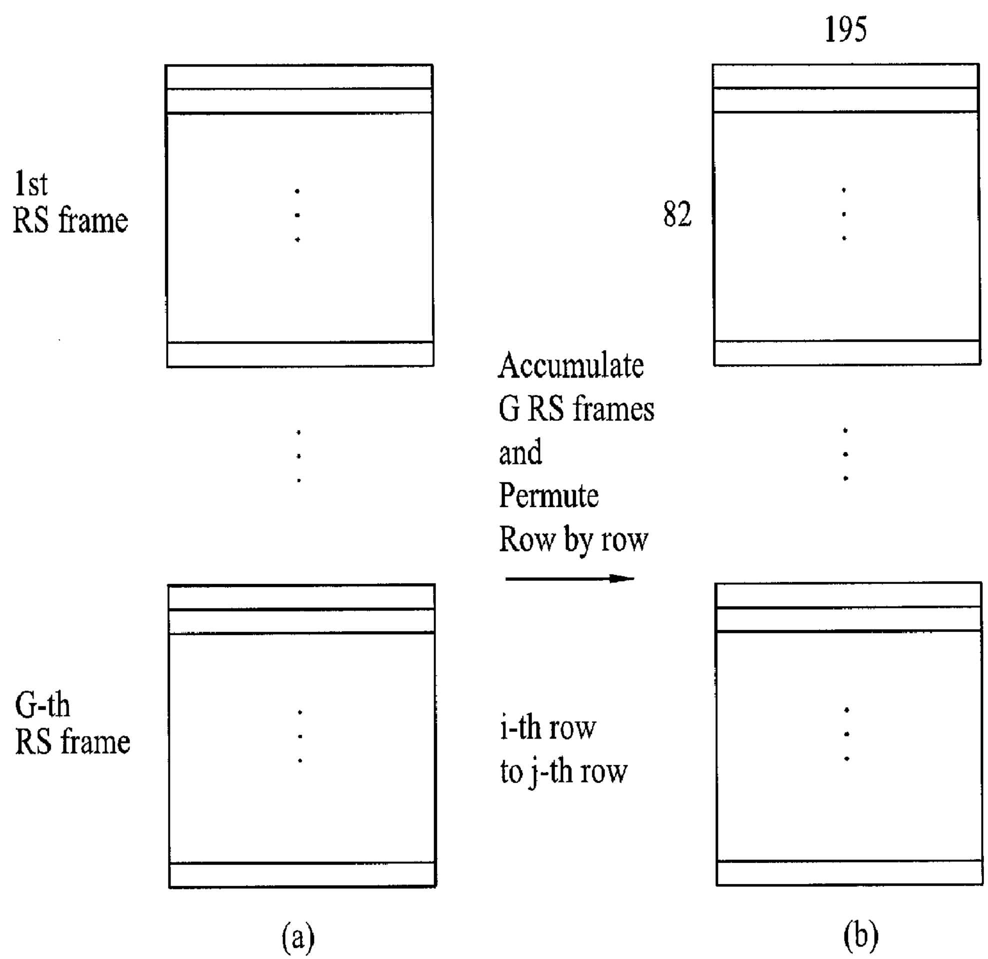
FIG. 4(*a*) and FIG. 4(*b*) illustrate examples showing the steps of a row permutation process according to an embodiment of the present invention.

FIG. 4 illustrates an example of performing a row permutation process in RS frame group units after grouping a plurality (G) of double RS-encoded RS frames in order to configure a RS frame group. When a RS frame including 195 bytes in each row and 82 bytes in each column is configured, as a result of the double RS encoding shown in FIG. 2 and FIG. 3, G number of RS frames consisting of 82 rows, as shown in FIG. 4(*a*), are grouped to configure a RS frame group consisting of 82*G number of 195-byte rows. When a row permutation process is performed on the above-described RS frame group by using a predetermined method, the position of the rows may differ prior to and after the row permutation process within the RS frame group. More specifically, the $i^{th}$ row of the RS frame group prior to the row permutation process, as shown in FIG. 4(*a*), is positioned in the $j^{th}$ row after row permutation, as shown in FIG. 4(*b*). The above-described relation between i and j can be easily understood with reference to Equation 1 below.

$$j=G(i \bmod 2)+\lfloor i/82 \rfloor$$

$$i=G(j \bmod G)+\lfloor j/G \rfloor \quad \text{Equation 1}$$

where $0 \leqq i,j < 82G$

Herein, each row of the RS frame group is configured of 195 bytes even after being processes with row permutation. At this point, the sizes of the RS frames prior to and after the row permutation process do not necessarily have to be the same. However, the total number of rows within the RS frame group must be identical prior to and after the row permutation process. For example, when it is assumed that the number of RS frames configuring the RS frame group prior to row permutation is equal to G and that the number of rows within one RS frame is equal to 82, there is no problem in performing row permutation even if the RS frame group after row permutation is configured of 2G RS frame groups and has 41 rows within each RS frame. In other words, the size of each RS frame prior to and after row permutation may be arbitrarily decided and modified by the system designer.

Figure 5:
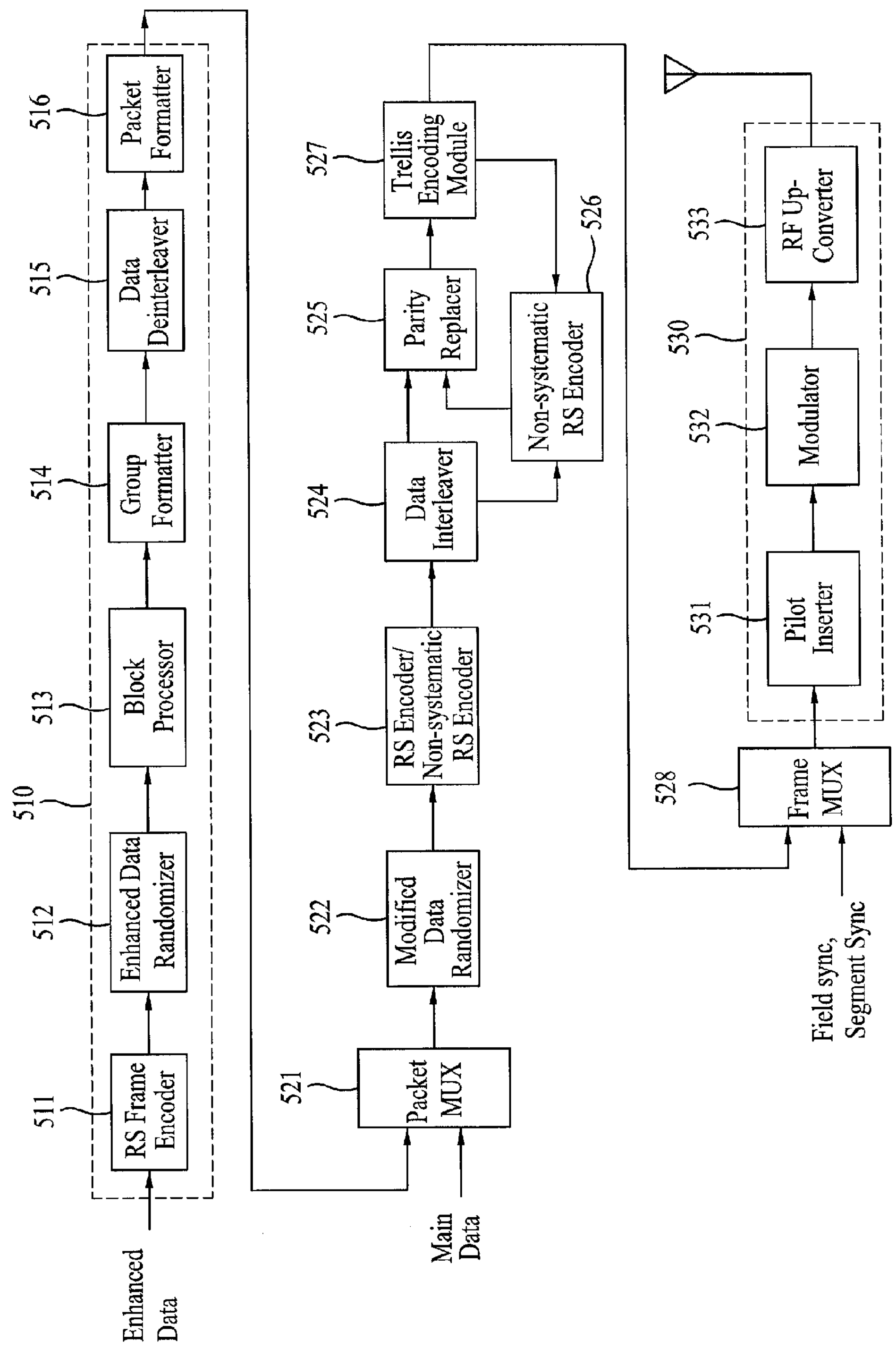
FIG. 5 illustrates a block diagram showing the structure of a digital broadcast transmitting system according to an embodiment of the present invention.
Figure 6:
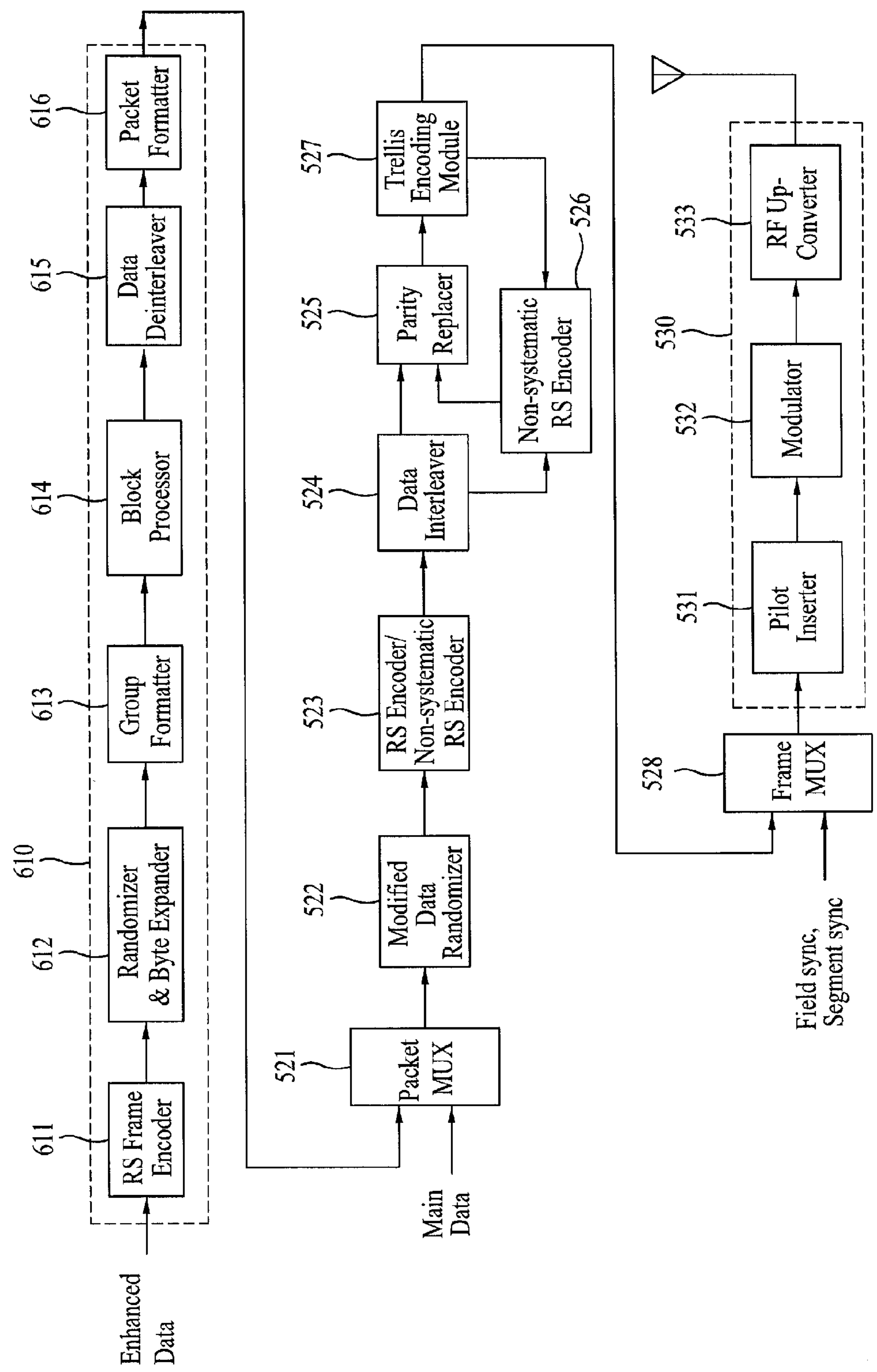
FIG. 6 illustrates a block diagram showing the structure of a digital broadcast transmitting system according to another embodiment of the present invention.
Figure 7:
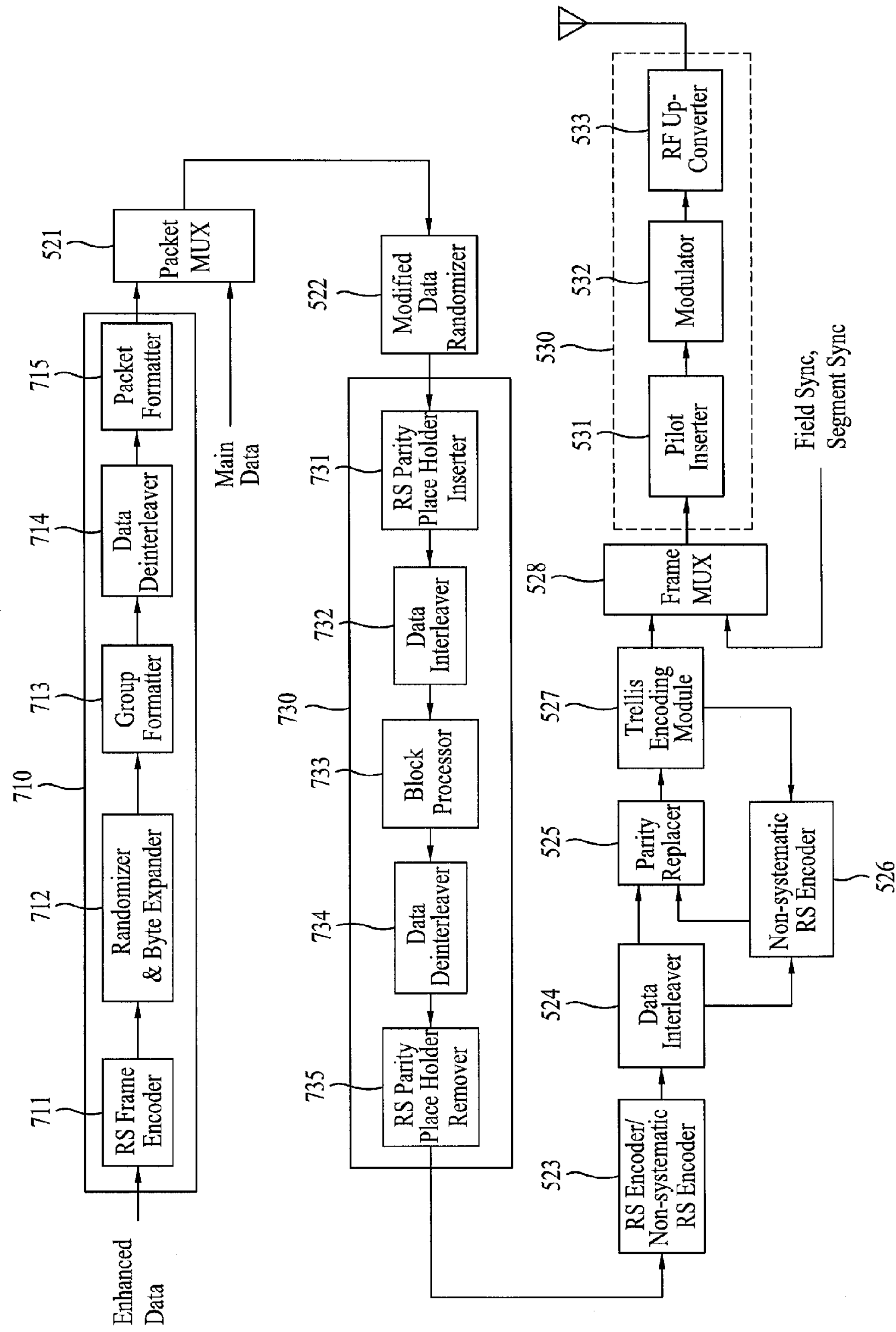
FIG. 7 illustrates a block diagram showing the structure of a digital broadcast transmitting system according to yet another embodiment of the present invention.

FIG. 5 to FIG. 7 illustrate examples of a digital broadcast transmitting system each including the above-described RS frame encoder. The digital broadcast transmitting system of FIG. 5 includes a pre-processor 510, a packet multiplexer 521, a data randomizer 522, a RS encoder/non-systematic RS encoder 523, a data interleaver 524, a parity replacer 525, a non-systematic RS encoder 526, a trellis encoder 527, a frame multiplexer 528, and a transmitting unit 530. The pre-processor 510 includes a RS frame encoder 511, an enhanced data randomizer 512, a block processor 513, a group formatter 514, a data deinterleaver 515, and a packet formatter 516. More specifically, the enhanced data randomizer 512, the block processor 513, the group formatter 514, the data deinterleaver 515, and the packet formatter 516 collectively correspond to the data processor 102 of FIG. 1.

In the above-described structure of the present invention, the main data are inputted to the packet multiplier 521, and the enhanced data are inputted to the pre-processor 510, which performs additional encoding so that the enhanced data can respond more effectively to noise and channel environment that undergoes frequent changes. The pre-processor 510 of the RS frame encoder 511 sequentially performs the double RS encoding process and the row permutation process on the enhanced data that are inputted as shown in the first embodiment of FIG. 2 and in the second embodiment of FIG. 3. Thereafter, the processed enhanced data are outputted to the enhanced data randomizer 512. The enhanced data randomizer 512 receives the enhanced data with added robustness from the double RS encoding and row permutation processes. The enhanced data randomizer 512, then, randomizes the received enhanced data and outputs the randomized data to the block processor 513. At this point, by having the enhanced data randomizer 512 randomize the enhanced data, a later randomizing process on the enhanced data performed by another randomizer 522 may be omitted. The randomizer of the conventional broadcast system may be identically used as the randomizer for randomizing the enhanced data. Alternatively, any other type of randomizer may also be used for this process.

The block processor 513 encodes the randomized enhanced data at a coding rate of M1/N1. Then, the block processor 513 outputs the M1/N1-rate coded data to the group formatter 514. For example, if 1 bit of the enhanced data is encoded to 2 bits and outputted, then M1 is equal to 1 and N1 is equal to 2 (i.e., M1=1 and N1=2). Alternatively, if 1 bit of the enhanced data is encoded to 4 bits and outputted, then M1 is equal to 1 and N1 is equal to 4 (i.e., M1=1 and N1=4). The group formatter 514 configures a data group based upon a predetermined rule. Thereafter, the received enhanced data are inserted in a corresponding area within the configured data group, which are then outputted to the data deinterleaver 515. At this point, the data group may be divided into at least one hierarchical area. Herein, the type of enhanced data being allocated to each hierarchical area may vary in accordance with the characteristics of the corresponding hierarchical layer.

In the example set forth in the description of the present invention, with respect to the data configuration prior to the data deinterleaving process, the data group may be divided into 3 hierarchical areas: a head area, a body area, and a tail area. More specifically, based on the data group being data-interleaved and outputted, the portion being outputted first corresponds to the head area, the portion being outputted next corresponds to the body area, and the portion being outputted last corresponds to the tail area. At this point, with respect to the data group being outputted to the data deinterleaver 515, data may be allocated to each the head, body, and tail areas of the data group so that the body area is entirely configured of the enhanced data, thereby preventing the enhanced data from being mixed with the main data in the body area.

The data group is divided into 3 different areas so that each area may function and be used differently. More specifically, the body area is allocated with enhanced data only so as to prevent any interference with the main data from occurring, thereby enabling more robust and effective receiving performance. On the other hand, in the head and tail areas, the enhanced data are mixed with the main data in accordance with the output order of the data from the interleaver. Thus, the receiving performance of the head and tail areas may be deteriorated as compared to that of the body area. Further, if a system inserting known data in the data group and outputting the known data inserted data group is used, and when a consecutively long set of known data is to be periodically inserted in the enhanced data, such known data may be inserted in the area where the enhanced data are not mixed with the main data based on the input order of the data deinterleaver. In other words, known data having a constant pre-determined length may be periodically inserted in the body area. However, it is difficult to periodically insert such known data having a constant pre-determined length in the head area and/or the tail area.

Therefore, the group formatter 514 inserts the inputted enhanced data in the corresponding area within the data group configured as described above. For example, the group formatter 514 allocates the received enhanced data to the body area. In addition, apart from the enhanced data, the group formatter 514 also allocates signaling information, which indicates overall transmission information, to the body area. More specifically, the signaling information corresponds to information required by the receiving system for receiving and processing data included in the data group. Herein, the signaling information may include data group information, and multiplexing information.

With respect to the data deinterleaving process, the group formatter 514 inserts a MPEG header place holder, a non-systematic RS parity place holder, and a main data place holder. Herein, the main data place is allocated because the enhanced data are mixed with the main data in the head and tail areas, based upon the input from the data deinterleaver. Also, with respect to the output data after being data-deinterleaved, the place holder for the MPEG header is allocated at the beginning of each packet. In addition, the group formatter 514 either inserts known data, which are generated based upon a pre-decided method, in a corresponding area, or inserts a known data place holder in a corresponding area so as to respectively insert the known data in a later process. The data group having the data or data place holder inserted thereto by the group formatter 514 is then inserted to the data deinterleaver 515. Herein, the head and tail areas may be used for inserting enhanced data or other types of data that are used to support other information data or enhanced data whenever necessary.

The data deinterleaver 515 performs an reverse process of the data interleaving process. In other words, the data deinterleaver 515 deinterleaves the received data group and outputs the deinterleaved data group to the packet formatter 516. The packet formatter 516 removes the main data place holder and the RS parity place holder, which were allocated for the deinterleaving process, from the received deinterleaved data. Then, the remaining portions of the received data are gathered (or grouped), and the MPEG header is inserted to replace the 4-byte MPEG header place holder. Also, in case the group formatter 514 inserted the known data place holder, the packet formatter 516 may either insert known data in replacement of the known data place holder, or may directly output the known data place holder without any modification for a replacement insertion in a later process. Thereafter, the packet formatter 516 configures the data within the data group, which is packet-formatted as described above, into a 188-byte unit MPEG TS packet. Then, the packet formatter 516 provides the configured MPEG TS packet to the packet multiplexer 521.

The packet multiplexer 521 multiplexes the 188-byte unit enhanced data packet, which is outputted from the packet formatter 516, with a main data packet in accordance with a pre-defined multiplexing method. Then, the packet multiplexer 521 outputs the multiplexed data to the data randomizer 522. The multiplexing method may be adjusted in accordance with a plurality of variables of the system design. One of the multiplexing methods of the packet multiplexer 521 is to identify an enhanced data burst section and a main data section along a time axis and alternately repeating the two sections. At this point, at least one data group may be transmitted from the enhanced data burst section, and only the main data may be transmitted from the main data section. Herein, the enhanced data burst section may also transmit main data. As described above, if the enhanced data are transmitted in the burst structure, the receiving system receiving only the enhanced data turns the power on only during the burst section in order to receive the enhanced data. Alternatively, the receiving system turns the power off during the remaining section, which corresponds to the main data section transmitting only the main data, so that the receiving system does not receive any portion of the main data. Thus, power consumption of the receiving system may be reduced.

If the inputted data correspond to the main data packet, the data randomizer 522 performs the same randomizing process as the conventional randomizer. More specifically, the data randomizer 522 discards (or removes) the MPEG synchronization byte included in the main data packet and randomizes the remaining 187 byte by using a pseudo random byte that is generated by the data randomizer 522. Then, the randomized data bytes are outputted to the RS encoder/non-systematic RS encoder 523. However, if the inputted data correspond to the enhanced data packet, the data randomizer 522 discards (or removes) the MPEG synchronization byte from the 4-byte MPEG header included in the enhanced data packet and randomizes only the remaining 3 bytes. Also, the data randomizer 522 outputs the remaining portion of enhanced data excluding the MPEG header to the RS encoder/non-systematic RS encoder 523 without performing the randomizing process. This is because the enhanced data randomizer 512 has already performed a randomizing process on the enhanced data in an earlier process. The known data (or the known data place holder) and the initialization data place holder included in the enhanced data packet may either randomized or not randomized.

The RS encoder/non-systematic RS encoder 523 RS-encodes the data randomized by the data randomizer 522 or the data bypassing the data randomizer 522 so as to add 20 bytes of RS parity to the corresponding data. Then, the RS encoder/non-systematic RS encoder 523 outputs the processed data to the data interleaver 524. At this point, if the inputted data correspond to the main data packet, the RS encoder/non-systematic RS encoder 523 performs a systematic RS-encoding process identical to that of the conventional broadcasting system, thereby adding 20 bytes of RS parity at the end of the 187-byte unit data. Alternatively, if the inputted data correspond to the enhanced data packet, the RS encoder/non-systematic RS encoder 523 performs a non-systematic RS-encoding process at a specific parity byte place within the enhanced data packet, thereby inserting the 20-byte RS parity. Herein, the data interleaver 524 corresponds to a byte unit convolutional interleaver. The output of the data interleaver 524 is inputted to the parity replacer 525 and the non-systematic RS encoder 526.

Meanwhile, a process of initializing a memory within the trellis encoder 527 is primarily required in order to decide the output data of the trellis encoder 527, which is located after the parity replacer 525, as the known data pre-defined according to an agreement between the receiving system and the transmitting system. More specifically, the memory of the trellis encoder 527 should first be initialized before the received known data sequence is trellis-encoded. At this point, the beginning portion of the known data sequence that is being received corresponds to the initialization data place holder and not the actual known data. Herein, the initialization data place holder has been included in the data by the group formatter 514 in an earlier process. Therefore, the process of generating initialization data and replacing the initialization data place holder of the corresponding memory with the generated initialization data are required to be performed immediately before the known data sequence being inputted is trellis-encoded.

Additionally, a value of the trellis memory initialization data is decided and generated based upon a memory status of the trellis encoder 527. Further, due to the newly replaced initialization data, a process of newly calculating the RS parity and replacing the RS parity, which is outputted from the data interleaver, with the newly calculated RS parity is required. Therefore, the non-systematic RS encoder 526 receives the enhanced data packet including the initialization data place holder, which is to be replaced with the actual initialization data, from the data interleaver 524 and also receives the initialization data from the trellis encoder 527. Among the inputted enhanced data packet, the initialization data place holder is replaced with the initialization data, and the RS parity data that are added to the enhanced data packet are removed. Thereafter, a new non-systematic RS parity is calculated and outputted to the parity replacer 525. Accordingly, the parity replacer 525 selects the output of the data interleaver 524 as the data within the enhanced data packet, and the parity replacer 525 selects the output of the non-systematic RS encoder 526 as the RS parity. The selected data are then outputted to the trellis encoder 527.

Meanwhile, if the main data packet is inputted or if the enhanced data packet, which does not include any initialization data place holder that is to be replaced, is inputted, the parity replacer 525 selects the data and RS parity that are outputted from the data interleaver 524. Then, the parity replacer 525 directly outputs the selected data to the trellis encoder 527 without any modification. The trellis encoder 527 converts the byte-unit data to symbol units and performs a 12-way interleaving process so as to trellis-encode the received data. Thereafter, the processed data are outputted to the frame multiplexer 528. The frame multiplexer 528 inserts a field synchronization signal and a segment synchronization signal to the data outputted from the trellis encoder 527 and, then, outputs the processed data to the transmitting unit 530. Herein, the transmitting unit 530 includes a pilot inserter 531, a modulator 532, and a radio frequency (RF) up-converter 533. The operations and roles of the transmitting unit 530 and its components are identical to those of the conventional transmitting system. Therefore, detailed description of the same will be omitted for simplicity.

The digital broadcast transmitting system of FIG. 6 includes a pre-processor 610, a packet multiplexer 521, a data randomizer 522, a RS encoder/non-systematic RS encoder 523, a data interleaver 524, a parity replacer 525, a non-systematic RS encoder 526, a trellis encoder 527, a frame multiplexer 528, and a transmitting unit 530. The pre-processor 610 includes a RS frame encoder 611, a randomizer/byte expansion unit 612, a group formatter 613, a block processor 614, a data deinterleaver 615, and a packet formatter 616. More specifically, the randomizer/byte expansion unit 612, the group formatter 613, the block processor 614, the data deinterleaver 615, and the packet formatter 616 collectively correspond to the data processor 102 of FIG. 1. Herein, the difference between the digital broadcast transmitting system of FIG. 6 and that of FIG. 5 is the positioning order of the group formatter and the block processor.

In FIG. 5, the group formatter 514 is located after the block processor 513, whereas in FIG. 6, the block processor 614 is placed after the group formatter 613. More specifically, in the digital broadcast transmitting system of FIG. 6, since the group formatter 613 is placed before the block processor 614, a byte-expansion process is required to be performed, in advance, before the group formatter 613 so that the block processor 614 can respond to the encoding process, thereby facilitating the operation of the group formatter 613. Therefore, in the digital broadcast transmitting system of FIG. 6, byte expansion may also be performed through randomizing and null data inserting processes by the randomizer/byte expanding unit 612. Conversely, in the digital broadcast transmitting system of FIG. 5, the group formatter 514 is placed before the block processor 513. And, since the encoding process of the block processor 513 directly performs the byte expansion process, a separate byte expansion process is not required. Therefore, the digital broadcast transmitting system shown in FIG. 5 only randomizes the enhanced data and does not perform any byte expansion process.

Hereinafter, only the pre-processor 610 of FIG. 6 will be described in detail, and the other blocks (i.e., reference numerals 521 to 528, and 530) may be identically applied as described above in FIG. 5. More specifically, the enhanced data are inputted to the pre-processor 610, which performs additional encoding so that the enhanced data can respond more effectively to noise and channel environment that undergoes frequent changes. The pre-processor 610 of the RS frame encoder 611 receives the enhanced data and configures a frame for the additional encoding process. Then, after performing the encoding process, the RS frame encoder 611 outputs the processed data to the randomizer/byte expansion unit 612. The RS frame encoder 611 sequentially performs the double RS encoding process and the row permutation process on the enhanced data that are inputted as shown in the first embodiment of FIG. 2 and in the second embodiment of FIG. 3. Thereafter, the processed enhanced data are outputted to the randomizer/byte expansion unit 612. The randomizer/byte expansion unit 612 receives the enhanced data with added robustness from the double RS encoding and row permutation processes. The randomizer/byte expansion unit 612, then, performs byte expansion by randomizing and inserting null data in the received enhanced data. At this point, by having the randomizer/byte expansion unit 612 randomize the enhanced data, a later randomizing process on the enhanced data performed by another randomizer 522 may be omitted. The randomizer of the conventional broadcast system may be identically used as the randomizer for randomizing the enhanced data. Alternatively, any other type of randomizer may also be used for this process.

Herein, the randomizing process and the byte expansion process may also be performed in a different order. More specifically, as described above, the byte expansion process may be performed after the randomizing process. And, conversely, the randomizing process may be performed after the byte expansion process. Any method may be selected in accordance with the overall characteristic of the broadcasting system. Moreover, the byte expansion method may vary in accordance with the coding rate of the block processor 614. More specifically, if the coding rate of the block processor 614 is M1/N1, the byte expansion unit expands the data bytes from M1 bytes to N1 bytes. For example, if the coding rate is ½, then 1 byte is expanded to 2 bytes. Alternatively, if the coding rate is ¼, then 1 byte is expanded to 4 bytes. The enhanced data being outputted from the randomizer/byte expansion unit 612 are inputted to the group formatter 613. As described in FIG. 5, the group formatter 613 creates (or configures) a data group, and then, the group formatter 613 inserts the received enhanced data in corresponding areas within the data group. The operations of the group formatter 613 are identical to those of the group formatter shown in FIG. 5, and, therefore, a detailed description of the same will be omitted for simplicity.

The data or corresponding place holder inserted in the data group by the group formatter 613 is (or are) inputted to the block processor 614. The block processor 614 performs additional encoding only on the enhanced data that are outputted from the group formatter 613. For example, if the randomizer/byte expansion unit 612 expanded data from 1 byte to 2 bytes, the block processor 614 encodes the enhanced data at a coding rate of ½. Alternatively, if the randomizer/byte expansion unit 612 expanded data from 1 byte to 4 bytes, the block processor 614 encodes the enhanced data at a coding rate of ¼. Additionally, the MPEG header place holder, the main data place holder, and the RS parity place holder are to be directly outputted without any data modification. Further, the known data (or the known data place holder) and the initialization data place holder are either set to be directly outputted without any data modification, or set to be replaced with the known data generated from the block processor 614 and then outputted. Herein, the data being encoded and replaced by the block processor 614 and bypassing block processor 614 are inputted to the data deinterleaver 615. The data deinterleaver 615 performs an reverse process of the data interleaver 524 by deinterleaving the inputted data and outputs the deinterleaved data to the packet formatter 616.

The packet formatter 616 removes the main data place holder and the RS parity place holder, which were allocated for the deinterleaving process, from the deinterleaved data that are being inputted. Thereafter, the packet formatter 616 gathers (or groups) the remaining portions of the data and, then, inserts the MPEG header instead of the 4-byte MPEG header place holder. The packet formatter 616 configures the packet-formatted data in a 188-byte unit MPEG TS packet, which is then supplied to the packet multiplexer 521. The packet multiplexer 521 multiplexes the 188-byte unit enhanced data packet and the main data packet, which are outputted from the packet formatter 616. Then, the multiplexed data are outputted to the data randomizer 522. The packet multiplexing method and the later operations are identical to those described in FIG. 5. Therefore, the detailed description of the same will be omitted for simplicity.

The digital broadcast transmitting system of FIG. 7 includes a pre-processor 710, a packet multiplexer 521, a data randomizer 522, a post-processor 730, a RS encoder/non-systematic RS encoder 523, a data interleaver 524, a parity replacer 525, a non-systematic RS encoder 526, a trellis encoder 527, a frame multiplexer 528, and a transmitting unit 530. The pre-processor 710 includes a RS frame encoder 711, a randomizer/byte expansion unit 712, a group formatter 713, a data deinterleaver 714, and a packet formatter 715. More specifically, the randomizer/byte expansion unit 712, the group formatter 713, the data deinterleaver 714, and the packet formatter 715 collectively correspond to the data processor 102 of FIG. 1. Also, the post-processor 730 includes a RS parity place holder inserter 731, a data interleaver 732, a block processor 733, a data deinterleaver 734, and a RS parity place holder remover 735.

In other words, apart from the block processor 614 included in the pre-processor of the digital broadcast transmitting system shown in FIG. 6, the pre-processor shown in both FIG. 6 and FIG. 7 have the same structure and operates identically. Also, the digital broadcast transmitting system of FIG. 7 further includes a post-processor 730 including a block processor 733. Furthermore, the packet multiplexer 521 and data randomizer 522 both provided between the pre-processor 710 and the post-processor 730, the RS encoder/non-systematic RS encoder 523 provided after the post-processor 730, the data interleaver 524, the parity replacer 525, the non-systematic encoder 526, the trellis encoder 527, the frame multiplexer 528, and the transmitting unit 530 have the same configuration and operates identically as those of FIG. 5. Therefore, a detailed description of the same will be omitted for simplicity. Hereinafter, referring to FIG. 7, only the post-processor 730 will be described in detail. On the other hand, detailed description of the remaining configuration blocks included in the transmitting system, shown in FIG. 7, having the same names as the configuration blocks shown in FIG. 5 or FIG. 6 will be omitted for simplicity.

More specifically, the data randomized by the data randomizer 522 or the data bypassing the data randomizer 522 are inputted to the RS parity place holder inserter 731 of the post-processor 730. If the inputted data correspond to the 187-byte main data packet, the RS parity place holder inserter 731 inserts a 20-byte RS parity place holder at the end of the 187-byte main data packet. Then, the RS parity place holder inserter 731 outputs the processed data to the data interleaver 732. Alternatively, if the inputted data correspond to the 187-byte enhanced data packet, a 20-byte RS parity place holder is inserted in the enhanced data packet for the non-systematic RS encoding process, which will be performed in a later process. Then, the RS parity place holder inserter 731 inserts the data bytes within the enhanced data packet in the byte places of the remaining 187 bytes of enhanced data, which are then outputted to the data interleaver 732. The data interleaver 732 performs a data interleaving process on the output of the RS parity place holder inserter 731 and, then, outputs the interleaved data to the block processor 733.

The block processor 733 performs additional encoding only on the enhanced data that are outputted from the data interleaver 732. For example, if the randomizer/byte expansion unit 712 expanded data from 1 byte to 2 bytes, the block processor 733 encodes the enhanced data at a coding rate of ½. Alternatively, if the randomizer/byte expansion unit 712 expanded data from 1 byte to 4 bytes, the block processor 733 encodes the enhanced data at a coding rate of ¼. The main data or RS parity place holders directly bypass the block processor 733. Additionally, the known data and the initialization data place holder also bypass the block processor 733. And, the known data place holder may be replaced by the known data generated from the block processor 733, which are then outputted. Herein, the data being encoded and replaced by the block processor 733 and bypassing block processor 733 are inputted to the data deinterleaver 734. The data deinterleaver 734 performs an reverse process of the data interleaver 732 by deinterleaving the inputted data and outputs the deinterleaved data to the RS parity place holder remover 735.

The RS parity place holder remover 735 removes the 20-byte RS parity place holder, which was inserted by the RS parity place holder inserter 731 for the operations of the data interleaver 732 and the data deinterleaver 734. Then, the RS parity place holder remover 735 outputs the processed data to the RS encoder/non-systematic RS encoder 523. If the inputted data correspond to the main data packet, the last 20 bytes, which correspond to the RS parity place holders, are removed from the total 207 data bytes. And, if the inputted data correspond to the enhanced data packet, the 20 bytes of the RS parity place holders that were inserted to perform the non-systematic RS-encoding process are removed from the total 207 data bytes. Herein, if the main data sequentially pass through the RS parity place holder inserter 731, the data interleaver 732, the block processor 733, the data deinterleaver 734, and the RS parity place holder remover 735, the main data become identical to the main data that were originally inputted to the RS parity place holder inserter 731. As described above, the embodiments of the digital broadcast transmitting system of the present invention shown in FIG. 5 to FIG. 7 are merely exemplary. And, therefore, the present invention is not limited to the examples set forth herein.

Figure 8:
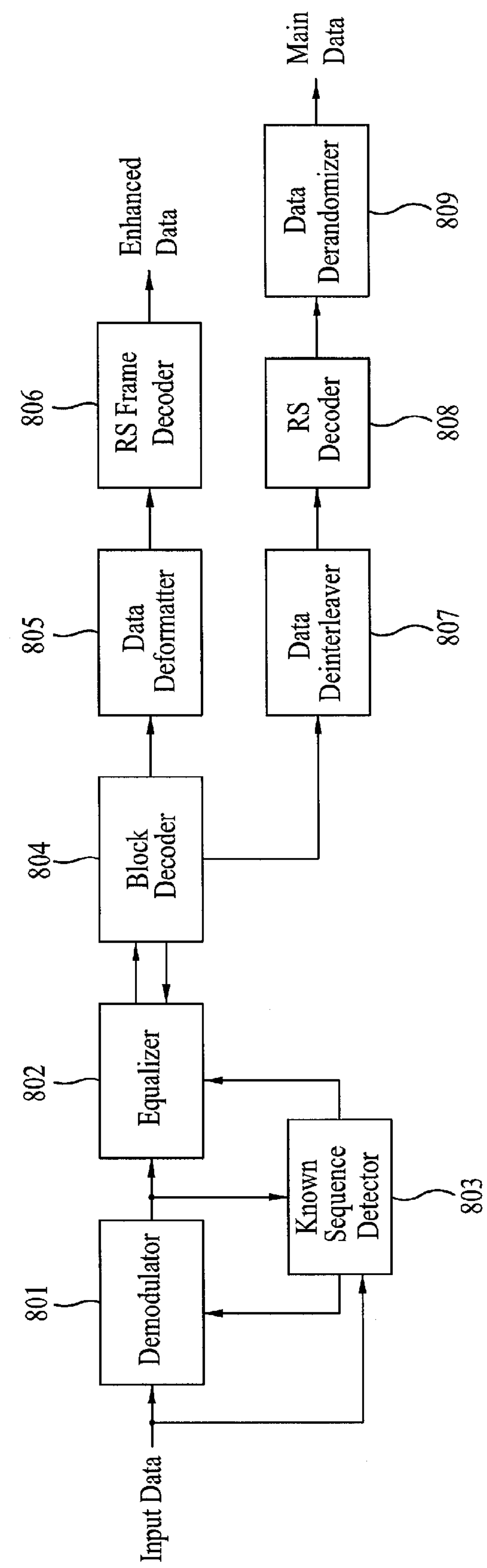
FIG. 8 illustrates a block diagram showing the structure of a digital broadcast receiving system according to an embodiment of the present invention.

FIG. 8 illustrates a block diagram showing a demodulating unit of a digital broadcast receiving system according to an embodiment of the present invention, wherein the demodulating unit is used for receiving data transmitted from the transmitting system, demodulating and equalizing the received data, so as to recover the processed data back to the initial (or original) data. Referring to FIG. 8, the demodulating unit of the digital broadcast receiving system may include a demodulator 801, an equalizer 802, a known sequence detector 803, a block decoder 804, a data deformatter 805, and a RS frame decoder 806. The demodulating unit of the digital broadcast receiving system may further include a data deinterleaver 807, a RS decoder 808, and a derandomizer 809.

More specifically, an intermediate frequency (IF) signal of a particular channel that is tuned by a tuner is inputted to the demodulator 801 and the known sequence detector 803. The demodulator 801 performs self gain control, carrier recovery, and timing recovery processes on the inputted IF signal, thereby modifying the IF signal to a baseband signal. Then, the demodulator 801 outputs the newly created baseband signal to the equalizer 802 and the known sequence detector 803. The equalizer 802 compensates the distortion of the channel included in the demodulated signal and then outputs the error-compensated signal to the block decoder 804.

At this point, the known sequence detector 803 detects the known sequence place inserted by the transmitting end from the input/output data of the demodulator 801 (i.e., the data prior to the demodulation or the data after the modulation). Thereafter, the place information along with the symbol column of the known sequence, which is generated from the detected place, is outputted to the demodulator 801, the equalizer 802, and the block decoder 804. Also, the known sequence detector 803 outputs a set of information to the block decoder 804. This set of information is used to allow the block decoder 804 of the receiving system to identify the enhanced data that are processed with additional encoding from the transmitting system and the main data that are not processed with additional encoding. This set of information is also used to indicate a stating point of a block in the enhanced encoder. In addition, although the connection status is not shown in FIG. 8, the information detected from the known sequence detector 803 may be used throughout the entire receiving system and may also be used in the data deformatter 805 and the RS frame decoder 806.

The demodulator 801 uses the known data symbol column during the timing and/or carrier recovery, thereby enhancing the demodulating performance. Similarly, the equalizer 802 uses the known data sequence, thereby enhancing the equalizing quality. Moreover, the decoding result of the block decoder 804 may be fed-back to the equalizer 802, thereby enhancing the equalizing performance. Meanwhile, if the data that are inputted to the block decoder 804 from the equalizer 802 correspond to the enhanced data being processed with both additional encoding and trellis encoding by the transmitting system, trellis decoding and additional decoding processes are performed as reverse processes of the transmitting system. Alternatively, if the data that are inputted to the block decoder 804 from the equalizer 802 correspond to the main data being processed only with the trellis encoding process and not the additional encoding process, then only the trellis decoding process is performed. The data group decoded by the block decoder 804 is inputted to the data deformatter 805, and the main data packet is inputted to the data deinterleaver 807.

More specifically, if the inputted data correspond to the main data, the block decoder 804 performs Viterbi decoding on the input data, so as to either output a hard decision value or to perform hard decision on a soft decision value and, accordingly, output the hard decided result. On the other hand, if the input data correspond to the enhanced data, the block decoder 804 outputs either a hard decision value or a soft decision value on the inputted enhanced data. If the inputted data correspond to the enhanced data, the block decoder 804 performs a decoding process on the data encoded by the block processor and the trellis encoder of the transmitting system. At this point, the data outputted from a block encoder of the pre-processor may correspond to an external code, and the data outputted from any one of the block processor and the trellis encoder may correspond to an internal code. Therefore, in order to maximize the coding performance of the external code when decoding such concatenated codes, a soft decision value should be outputted from the decoder of the internal code.

Accordingly, the block decoder 804 may output a hard decision value on the enhanced data. And, if required, it is preferable for the block decoder 804 to output a soft decision value. More specifically, depending upon the system design or conditions, the block decoder 804 outputs any one of the soft decision value and the hard decision value with respect to the enhanced data, and the block decoder 804 outputs the hard decision value with respect to the main data. Meanwhile, the data deinterleaver 807, the RS decoder 808, and the derandomizer 809 are configuration blocks required for receiving the main data. Therefore, in a receiving system that is structured for receiving only the enhanced data, the above-mentioned configuration blocks may not be required in the structure.

The data deinterleaver 807 performs an reverse process of the data interleaver. In other words, the data deinterleaver 807 deinterleaves the main data and outputs the deinterleaved main data to the RS decoder 808. The RS decoder 808 performs a systematic RS decoding process on the deinterleaved data and outputs the processed data to the derandomizer 809. The derandomizer 809 receives the output of the RS decoder 808 and generates a pseudo random data byte identical to that of the randomizer included in the digital broadcast transmitting system (or DTV transmitting system). Thereafter, the derandomizer 809 performs a bitwise exclusive OR (XOR) operation on the generated pseudo random data byte, thereby inserting the MPEG synchronization bytes to the beginning of each packet so as to output the data in 188-byte main data packet units.

Furthermore, during the derandomizing process, if the RS frame decoder 806 requires soft decision and, accordingly, receives the soft decision value from the block decoder 804, it is difficult to perform a bitwise exclusive OR (XOR) operation between the soft decision value and the pseudo random bit, which is used for derandomizing. Therefore, when an XOR operation is performed between the pseudo random bit and the soft decision value of the enhanced data bit, and when the pseudo random bit is equal to '1', the data deformatter 805 changes the code of the soft decision value and then outputs the changed code. On the other hand, if the pseudo random bit is equal to '0', the data deformatter 805 outputs the soft decision value without any change in the code. Thus, the soft decision status may be maintained and transmitted to the RS frame decoder 806.

If the pseudo random bit is equal to '1' as described above, the code of the soft decision value is changed because, when an XOR operation is performed between the pseudo random bit and the input data in the randomizer of the transmitting system, and when the pseudo random bit is equal to '1', the code of the output data bit becomes the opposite of the input data (i.e., 0 XOR 1=1 and 1 XOR 0=0). More specifically, if the pseudo random bit generated from the data deformatter 805 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted.

Figure 9:
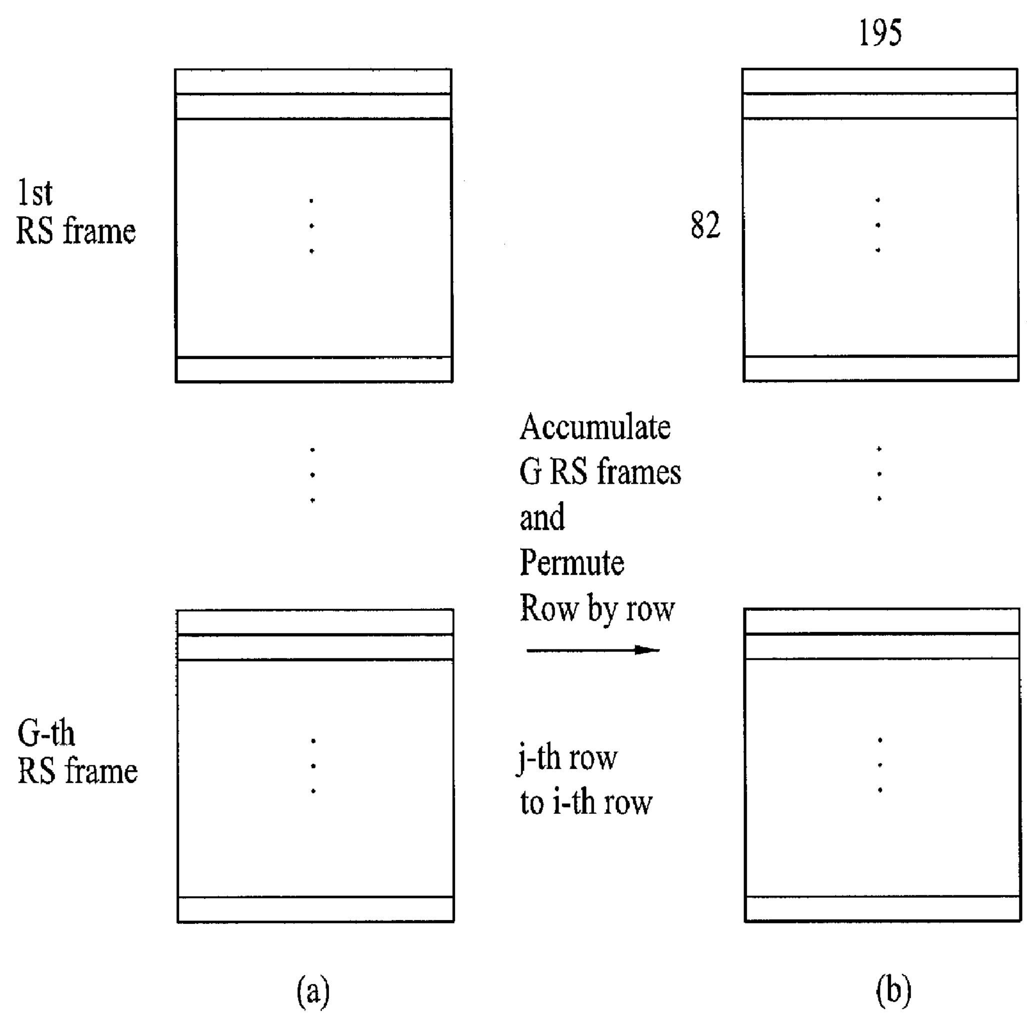
FIG. 9(*a*) and FIG. 9(*b*) illustrate examples showing the steps of an reverse row permutation process according to an embodiment of the present invention.

The RS frame decoder 806 performs an reverse process of the RS frame encoder included in the transmitting system and, then, outputs the processed enhanced data. For example, if the transmitting system performed the double RS encoding process and the row permutation process as described above, a RS frame including 82 data packets (or rows) each configured of 195 bytes is inputted to the RS frame decoder 806. The RS frame decoder 806 groups G number of the above-described RS frames, thereby configuring a RS frame group including 82*G RS frames. Subsequently, by performing an reverse process of the row permutation process on the RS frame group configured of 82*G number of 195-byte data packets (or rows), as shown in FIG. 9, the RS frame group is aligned in its original order prior to being processed with the row permutation process in the transmitting system. Thereafter, the RS frame group is divided into G number of frames each configured of 82 195-byte data packets. At this point, each of the RS frames is individually processed with double RS encoding by the transmitting system. Therefore, the receiving system performs the double RS decoding process in an reverse order of the double RS encoding process performed in the transmitting system.

For example, if the primary RS encoding process is performed in a row direction, as shown in FIG. 2, and a secondary RS encoding process is performed on the RS-encoded result of the primary RS encoding process in a column direction, also as shown in FIG. 2, then the RS frame decoder 806 performs a primary decoding process on each RS frame in a column direction and, then, performs a secondary decoding process on the result of the primary decoding process in a row direction. Then, in accordance with a pre-decided condition, the primary and secondary RS decoding processes may each be repeated or ended. Conversely, if the primary RS encoding process is performed in a column direction, as shown in FIG. 3, and a secondary RS encoding process is performed on the RS-encoded result of the primary RS encoding process in a row direction, also as shown in FIG. 3, then the RS frame decoder 806 performs a primary decoding process on each RS frame in a row direction and, then, performs a secondary decoding process on the result of the primary decoding process in a column direction. Then, in accordance with a pre-decided condition, the primary and secondary RS decoding processes may each be repeated or ended.

A plurality of conditions may be included as the pre-determined condition. For example, in the present invention, whether to perform repetition or not is decided based upon a pre-determined number of repetitions and a number of errors corrected by performing the secondary RS decoding process. More specifically, if the pre-determined maximum number of repetitions has been performed, or if no additional error correction has been made as a result of performing the secondary RS decoding process, the decoding process is terminated. Otherwise, in other cases excluding the above-described cases, the primary and secondary RS decoding processes are repeated.

Figure 10:
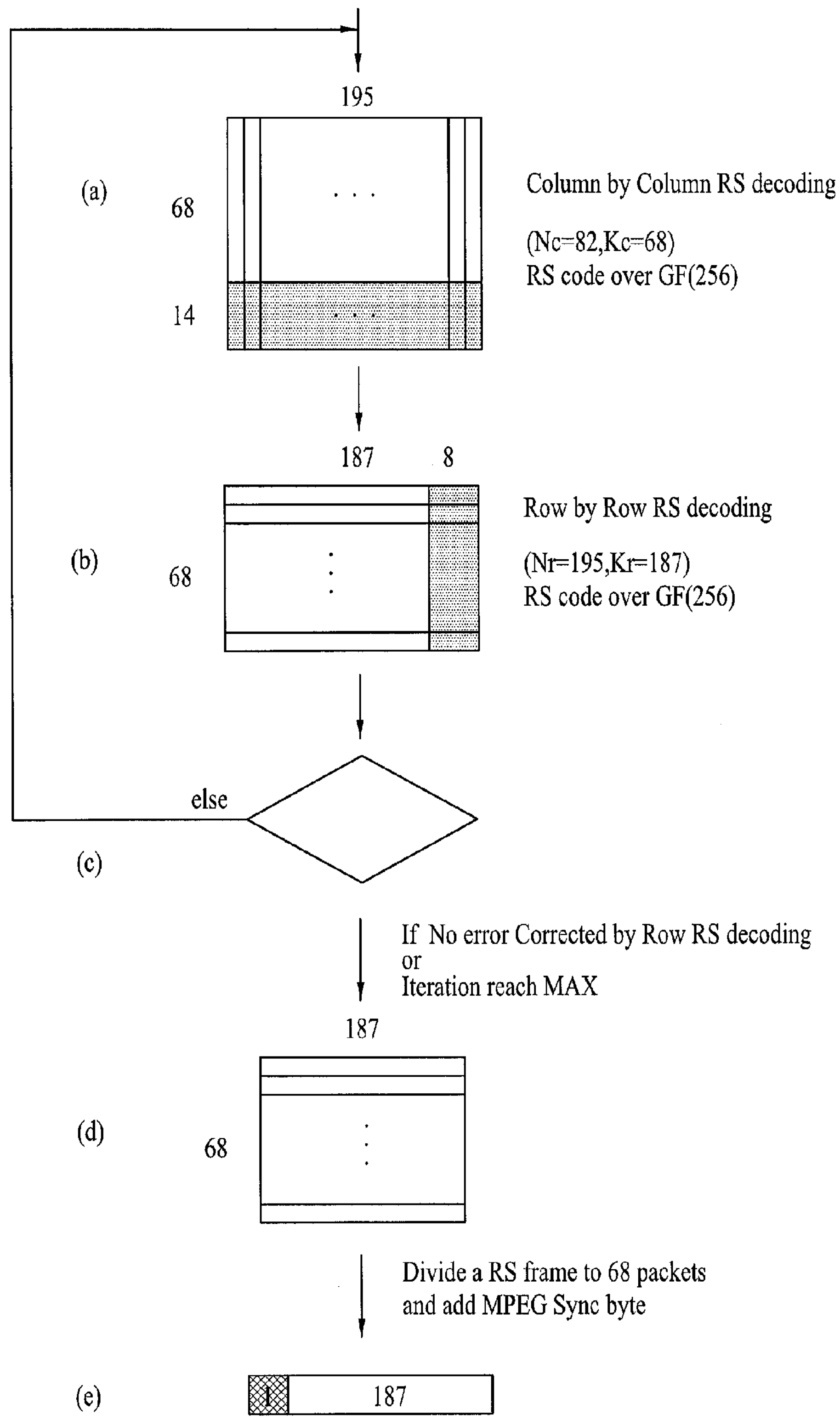
FIG. 10(*a*) to FIG. 10(*e*) illustrate examples showing the steps of a double error correction decoding process according to an embodiment of the present invention.

FIG. 10 illustrates a flow chart of the RS decoding process according to the embodiment of the present invention. Most particularly, FIG. 10 illustrates an example of a double RS decoding process that corresponds to the double RS encoding process performed as shown in FIG. 2. The process first begins by performing a (82,68)-RS decoding process in a column direction, as shown in FIG. 10(*a*), on each RS frame divided by the reverse process of row permutation. Then, a (195,187)-RS decoding process is performed in a row direction on the (82,68)-RS decoded RS frame, as shown in FIG. 10(*b*). Herein, FIG. 10(*a*) is an example of performing the (82,68)-RS decoding process in a column direction on the RS frame having 82 195-byte rows. And, FIG. 10(*b*) is an example of performing the (195,187)-RS decoding process in a column direction on the RS frame having 68 195-byte rows. After performing the (195,187)-RS decoding process in a row direction, it is verified, as shown in FIG. 10(*c*), whether the pre-determined maximum number of repetitions has all been performed or whether no additional error correction has been made as a result of performing the secondary RS decoding process.

If FIG. 10(*c*) indicates that the pre-determined maximum number of repetitions remains and that at least one set of data has been error-corrected by the RS decoding process performed in a row direction, the process returns to the step shown in FIG. 10(*a*), so as to repeat the column-direction RS decoding process on the RS frame that has been RS decoded in a row direction. More specifically, if at least one set of error-corrected data exists as a result of performing the RS decoding process in a row direction, and when the RS decoding process in a column direction is repeated on the RS frame that has been RS decoded in a row direction, a larger possibility of additionally correcting errors may be provided during the RS decoding process in the column direction. Further, similarly, if a RS decoding process in a row direction is performed on the additionally error-corrected RS frame, a larger possibility of additionally correcting errors may be provided. Therefore, in the present invention, in order to enhance the decoding performance when at least one set of error-corrected data exists after performing the RS decoding process in a row direction within the range of the pre-determined number of possible repetitions, the RS decoding processes in both row and column directions are repeatedly performed based upon the error correction result.

Herein, if the RS decoding processes in column and row directions are repeated, error correction is repeatedly performed, thereby enhancing the decoding performance. However, in a particular error status, the error correction that occurred by performing the RS decoding process in a column direction creates an error in a row direction. And, the error correction that occurred by performing the RS decoding process in a row direction creates an error in a column direction. Eventually, new errors may endlessly occur as described above. Therefore, in order to prevent such endless errors from occurring, the number of possible repetition is limited in the present invention. On the other hand, if there is no set of error corrected data as a result of the RS decoding process in a row direction, this indicates that there is no error existing in the RS frame. Accordingly, the RS decoding process is not required to be repeated.

If the pre-determined maximum number of repetitions does not remain, and if not even one set of data has been error-corrected by the RS decoding process performed in a row direction, then the RS decoding process is terminated, as shown in FIG. 10(*d*). Then, the 14-byte parity data, which were added at the end of each column during the double RS encoding process, and the 8-byte parity data, which were added at the end of each row, will be removed. In other words, 68 187-byte rows (i.e., data packets) may be obtained. Also, as shown in FIG. 10(*e*), the MPEG synchronization byte, which was removed by the transmitting system, is added at the beginning of each 187-byte row. Then, the enhanced TS packet recovered to its original 188-byte configuration is outputted. As described above, FIG. 10 illustrates the process of performing a double RS decoding process that corresponds to the double RS encoding process shown in FIG. 10.

Meanwhile, the example shown in FIG. 10 may be directly applied to when performing the double RS encoding process, as shown in FIG. 3, apart from the double RS decoding process performing a primary RS decoding process in a row direction and a secondary RS decoding process in a column direction. Therefore, a detailed description of the same will be omitted for simplicity. Herein, the number of repetition, which decides whether to repeat the RS decoding process, and the number of error-corrected sets of data may vary. Accordingly, the present invention is not limited only to the examples set forth herein.

In the transmitting system shown in FIG. 5, the enhanced data randomizer 512 may be placed before the RS frame encoder 511. Also, in the transmitting system shown in either FIG. 6 or FIG. 7, only the randomizing function of the randomizer/byte expansion unit 612 or 712 may be positioned before the RS frame encoder. In this case, in the receiving system shown in FIG. 8, the derandomizing function included in the data deformatter 805 is placed after the RS frame decoder 806. Furthermore, in the transmitting system shown in FIG. 5, FIG. 6, or FIG. 7, if the randomizer is placed in a foremost position within the pre-processor 510, 610, or 710, the function of removing the MPEG synchronization byte, which is originally performed by the RS frame encoder 511, 611, or 711, may also be performed by the randomizer.

FIG. 11 illustrates a block diagram showing the structure of a digital broadcast transmitting system according to an embodiment of the present invention. The digital broadcast (or DTV) transmitting system includes a pre-processor 910, a packet multiplexer 921, a data randomizer 922, a Reed-Solomon (RS) encoder/non-systematic RS encoder 923, a data interleaver 924, a parity byte replacer 925, a non-systematic RS encoder 926, a frame multiplexer 928, and a transmitting system 930. The pre-processor 910 includes an enhanced data randomizer 911, a RS frame encoder 912, a block processor 913, a group formatter 914, a data deinterleaver 915, and a packet formatter 916.

In the present invention having the above-described structure, main data are inputted to the packet multiplexer 921. Enhanced data are inputted to the enhanced data randomizer 911 of the pre-processor 910, wherein an additional coding process is performed so that the present invention can respond swiftly and appropriately against noise and change in channel. The enhanced data randomizer 911 randomizes the received enhanced data and outputs the randomized enhanced data to the RS frame encoder 912. At this point, by having the enhanced data randomizer 911 perform the randomizing process on the enhanced data, the randomizing process on the enhanced data by the data randomizer 922 in a later process may be omitted. Either the randomizer of the conventional broadcast system may be used as the randomizer for randomizing the enhanced data, or any other type of randomizer may be used herein.

The RS frame encoder 912 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 912 also includes a process of mixing in row units many sets of enhanced data each having a pre-determined size. By performing an error correction coding process on the inputted enhanced data, the RS frame encoder 912 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 912 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235,187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 912 is inputted to the block processor 913. The block processor 913 codes the RS-coded and CRC-coded enhanced data at a coding rate of M1/N1. Then, the block processor 913 outputs the M1/N1-rate coded enhanced data to the group formatter 914. In order to do so, the block processor 913 identifies the block data bytes being inputted from the RS frame encoder 912 as bits.

The block processor 913 may receive supplemental information data such as signaling information, which include information on the system, and identifies the supplemental information data bytes as data bits. Herein, the supplemental information data, such as the signaling information, may equally pass through the enhanced data randomizer 911 and the RS frame encoder 912 so as to be inputted to the block processor 913. Alternatively, the supplemental information data may be directly inputted to the block processor 913 without passing through the enhanced data randomizer 911 and the RS frame encoder 912. The signaling information corresponds to information required for receiving and processing data included in the data group in the receiving system. Such signaling information includes data group information, multiplexing information, and burst information.

As a M1/N1-rate encoder, the block processor 913 codes the inputted data at a coding rate of M1/N1 and then outputs the M1/N1-rate coded data. For example, if 1 bit of the input data is coded to 2 bits and outputted, then M1 is equal to 1 and N1 is equal to 2 (i.e., M1=1 and N1=2). Alternatively, if 1 bit of the input data is coded to 4 bits and outputted, then M1 is equal to 1 and N1 is equal to 4 (i.e., M1=1 and N1=4). As an example of the present invention, it is assumed that the block processor 913 performs a coding process at a coding rate of ½ (also referred to as a ½-rate coding process) or a coding process at a coding rate of ¼ (also referred to as a ¼-rate coding process). More specifically, the block processor 913 codes the received enhanced data and supplemental information data, such as the signaling information, at either a coding rate of ½ or a coding rate of ¼. Thereafter, the supplemental information data, such as the signaling information, are identified and processed as enhanced data.

Since the ¼-rate coding process has a higher coding rate than the ½-rate coding process, greater error correction ability may be provided. Therefore, in a later process, by allocating the ¼-rate coded data in an area with deficient receiving performance within the group formatter 914, and by allocating the ½-rate coded data in an area with excellent receiving performance, the difference in the overall performance may be reduced. More specifically, in case of performing the ½-rate coding process, the block processor 913 receives 1 bit and codes the received 1 bit to 2 bits (i.e., 1 symbol). Then, the block processor 913 outputs the processed 2 bits (or 1 symbol). On the other hand, in case of performing the ¼-rate coding process, the block processor 913 receives 1 bit and codes the received 1 bit to 4 bits (i.e., 2 symbols). Then, the block processor 913 outputs the processed 4 bits (or 2 symbols). Additionally, the block processor 913 performs a block interleaving process in symbol units on the symbol-coded data. Subsequently, the block processor 913 converts to bytes the data symbols that are block-interleaved and have the order rearranged.

The group formatter 914 inserts the enhanced data outputted from the block processor 913 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each data group may be configured to include a field synchronization signal.

In another example given in the present invention, a data group is divided into A, B, and C regions in a data configuration prior to data deinterleaving.

Figure 12:
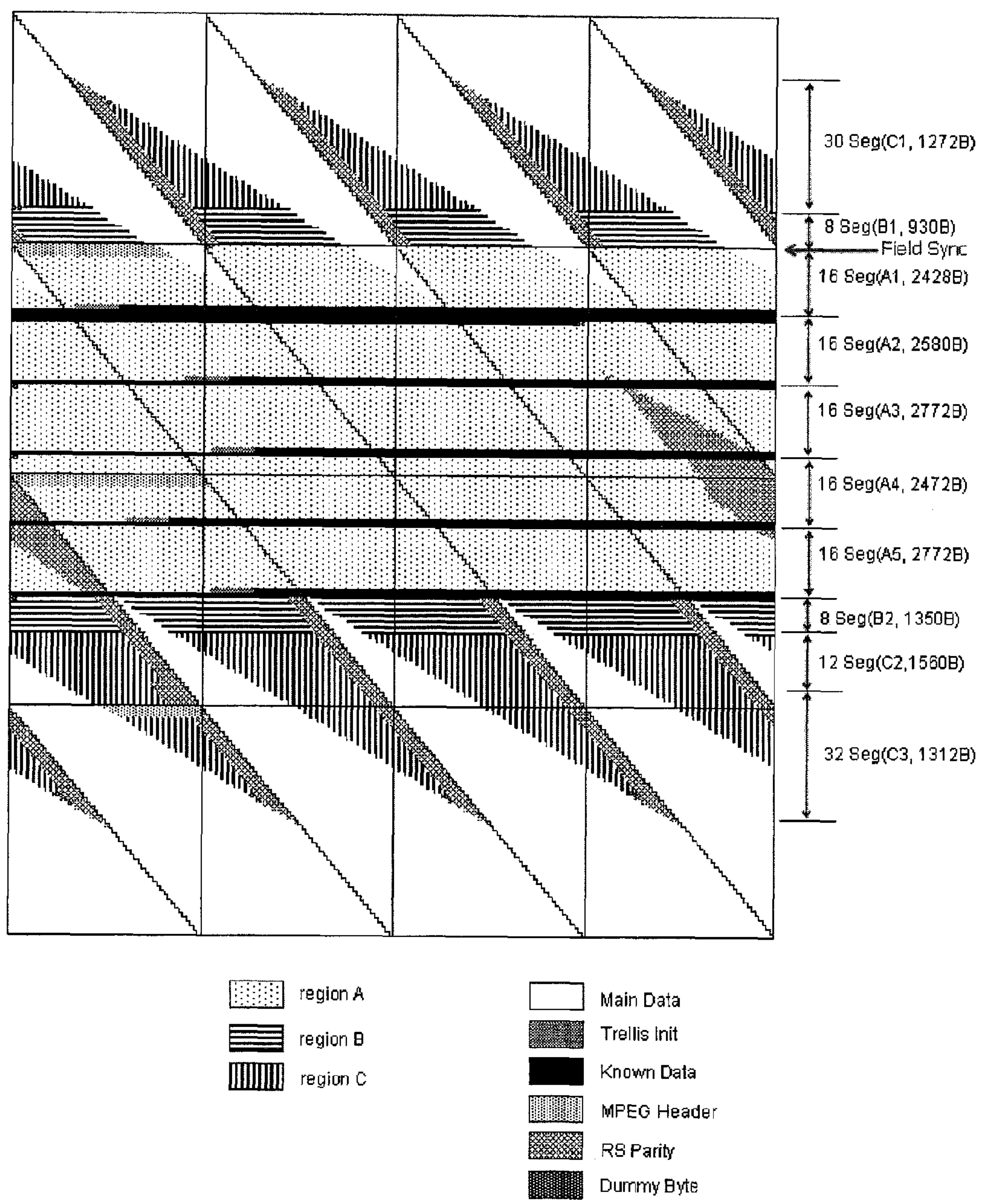
FIG. 12 and FIG. 13 illustrate another examples of data configuration at before and after ends of a data deinterleaver in a transmitting system according to the present invention.
Figure 13:
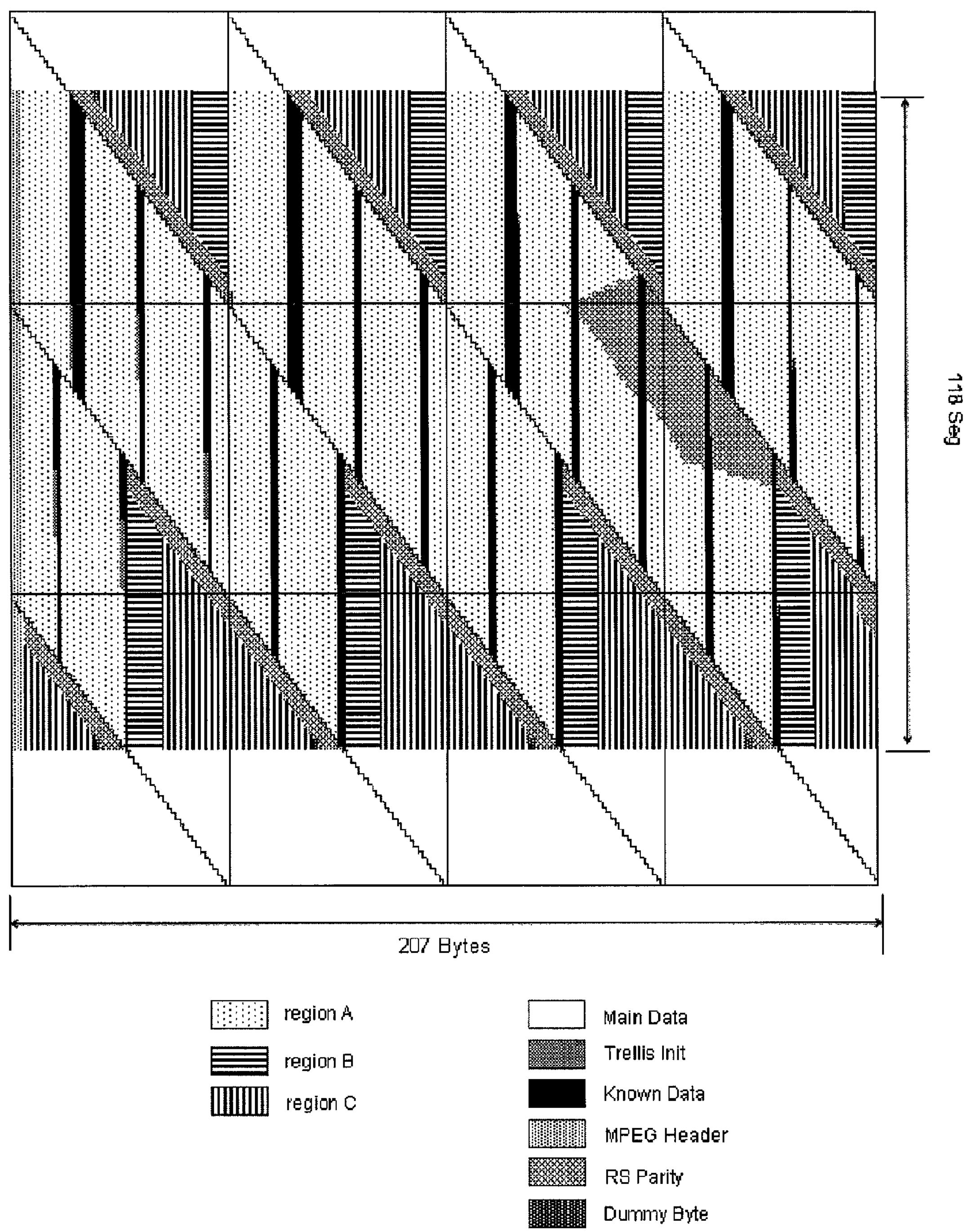

FIG. 12 illustrates an alignment of data before being data deinterleaved and identified, and FIG. 13 illustrates an alignment of data after being data deinterleaved and identified. More specifically, a data structure identical to that shown in FIG. 12 is transmitted to a receiving system. Also, the data group configured to have the same structure as the data structure shown in FIG. 12 is inputted to the data deinterleaver 915.

As described above, FIG. 12 illustrates a data structure prior to data deinterleaving that is divided into 3 regions, such as region A, region B, and region C. Also, in the present invention, each of the regions A to C is further divided into a plurality of regions. Referring to FIG. 12, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of enhanced data, which are inputted, may also vary depending upon the characteristic of each region.

In the example of the present invention, the data structure is divided into regions A to C based upon the level of interference of the main data. Herein, the data group is divided into a plurality of regions to be used for different purposes. More specifically, a region of the main data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the enhanced data, the known data having a predetermined length may be periodically inserted in the region having no interference from the main data (e.g., region A). However, due to interference from the main data, it is difficult to periodically insert known data and also to insert consecutively long known data to a region having interference from the main data (e.g., region B and region C).

Hereinafter, examples of allocating data to region A (A1 to A5), region B (B1 and B2), and region C (C1 to C3) will now be described in detail with reference to FIG. 12. The data group size, the number of hierarchically divided regions within the data group and the size of each region, and the number of enhanced data bytes that can be inserted in each hierarchically divided region of FIG. 12 are merely examples given to facilitate the understanding of the present invention. Herein, the group formatter 914 creates a data group including places in which field synchronization bytes are to be inserted, so as to create the data group that will hereinafter be described in detail.

More specifically, region A is a region within the data group in which a long known data sequence may be periodically inserted, and in which includes regions wherein the main data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 12, 2428 bytes of the enhanced data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the enhanced data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 930 bytes of the enhanced data may be inserted in the region B1, and 1350 bytes may be inserted in region B2. Similarly, trellis initialization data or known data, MPEG header, and RS parity are not included in the enhanced data. In case of region B, the receiving system may perform equalization by using channel information obtained from the field synchronization section. Alternatively, the receiving system may also perform equalization by using channel information that may be obtained from the last known data sequence, thereby enabling the system to respond to the channel changes.

Region C includes a region located within 30 segments including and preceding the 9$^{th}$ segment of the field synchronization region (chronologically located before region A) (e.g., region C1), a region located within 12 segments including and following the 9$^{th}$ segment of the very last known data sequence within the data group (chronologically located after region A) (e.g., region C2), and a region located in 32 segments after the region C2 (e.g., region C3). For example, 1272 bytes of the enhanced data may be inserted in the region C1, 1560 bytes may be inserted in region C2, and 1312 bytes may be inserted in region C3. Similarly, trellis initialization data or known data, MPEG header, and RS parity are not included in the enhanced data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 913 may encode the enhanced data, which are to be inserted to each region based upon the characteristic of each hierarchical region, at a different coding rate. For example, the block processor 913 may encode the enhanced data, which are to be inserted in regions A1 to A5 of region A, at a coding rate of ½. Then, the group formatter 914 may insert the ½-rate encoded enhanced data to regions A1 to A5.

The block processor 913 may encode the enhanced data, which are to be inserted in regions B1 and B2 of region B, at a coding rate of ¼ having higher error correction ability as compared to the ½-coding rate. Then, the group formatter 914 inserts the ¼-rate coded enhanced data in region B1 and region 82. Furthermore, the block processor 913 may encode the enhanced data, which are to be inserted in regions C1 to C3 of region C, at a coding rate of ¼ or a coding rate having higher error correction ability than the ¼-coding rate. Then, the group formatter 914 may either insert the encoded enhanced data to regions C1 to C3, as described above, or leave the data in a reserved region for future usage.

In addition, the group formatter 914 also inserts supplemental data, such as signaling information that notifies the overall transmission information, other than the enhanced data in the data group. Also, apart from the encoded enhanced data outputted from the block processor 913, the group formatter 914 also inserts MPEG header place holders, non-systematic RS parity place holders, main data place holders, which are related to data deinterleaving in a later process, as shown in FIG. 12. Herein, the main data place holders are inserted because the enhanced data bytes and the main data bytes are alternately mixed with one another in regions B and C based upon the input of the data deinterleaver, as shown in FIG. 12. For example, based upon the data outputted after data deinterleaving, the place holder for the MPEG header may be allocated at the very beginning of each packet.

Furthermore, the group formatter 914 either inserts known data generated in accordance with a pre-determined method or inserts known data place holders for inserting the known data in a later process. Additionally, place holders for initializing the trellis encoder 927 are also inserted in the corresponding regions. For example, the initialization data place holders may be inserted in the beginning of the known data sequence. Herein, the size of the enhanced data that can be inserted in a data group may vary in accordance with the sizes of the trellis initialization place holders or known data (or known data place holders), MPEG header place holders, and RS parity place holders.

The output of the group formatter 914 is inputted to the data deinterleaver 915. And, the data deinterleaver 915 deinterleaves data by performing an reverse process of the data interleaver on the data and place holders within the data group, which are then outputted to the packet formatter 916. More specifically, when the data and place holders within the data group configured, as shown in FIG. 12, are deinterleaved by the data deinterleaver 915, the data group being outputted to the packet formatter 916 is configured to have the structure shown in FIG. 13.

Among the data deinterleaved and inputted, the packet formatter 916 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 914 inserts the known data place holder, the packet formatter 916 may either insert actual known data in the known data place holder or output the known data place holder without any change or modification for a replacement insertion in a later process. Afterwards, the packet formatter 916 divides the data within the above-described packet-formatted data group into 188-byte unit enhanced data packets (i.e., MPEG TS packets), which are then provided to the packet multiplexer 921. The packet multiplexer 921 multiplexes the 188-byte unit enhanced data packet and main data packet outputted from the packet formatter 916 according to a pre-defined multiplexing method. Subsequently, the multiplexed data packets are outputted to the data randomizer 922. The multiplexing method may be modified or altered in accordance with diverse variables of the system design.

As an example of the multiplexing method of the packet multiplexer 921, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 922 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 923. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 923. This is because the randomizing process has already been performed on the enhanced data by the enhanced data randomizer 911 in an earlier process. Herein, a data randomizing process may or may not be performed on the known data (or known data place holder) and the initialization data place holder included in the enhanced data packet.

The RS encoder/non-systematic RS encoder 923 RS-codes the data randomized by the data randomizer 922 or the data bypassing the data randomizer 922. Then, the RS encoder/non-systematic RS encoder 923 adds a 20-byte RS parity to the coded data, thereby outputting the RS-parity-added data to the data interleaver 924. At this point, if the inputted data correspond to the main data packet, the RS encoder/non-systematic RS encoder 923 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 924 corresponds to a byte unit convolutional interleaver. The output of the data interleaver 924 is inputted to the parity byte replacer 925 and the non-systematic RS encoder 926.

Meanwhile, a memory within the trellis encoding module 927, which is positioned after the parity byte replacer 925, should first be initialized in order to allow the output data of the trellis encoding module 927 so as to become the known data defined based upon an agreement between the receiving system and the transmitting system. More specifically, the memory of the trellis encoding module 927 should first be initialized before the known data sequence being inputted is trellis-encoded. At this point, the beginning of the known data sequence that is inputted corresponds to the initialization data place holder inserted by the group formatter 914 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 927, thereby generating the trellis memory initialization data accordingly. Due to the influence of the replace initialization data, a process of recalculating the RS parity, thereby replacing the RS parity outputted from the trellis encoding module 927 with the newly calculated RS parity is required. Accordingly, the non-systematic RS encoder 926 receives the enhanced data packet including the initialization data place holder that is to be replaced with the initialization data from the data interleaver 924 and also receives the initialization data from the trellis encoding module 927. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 925. Accordingly, the parity byte replacer 925 selects the output of the data interleaver 924 as the data within the enhanced data packet, and selects the output of the non-systematic RS encoder 926 as the RS parity. Thereafter, the parity byte replacer 925 outputs the selected data.

Meanwhile, if the main data packet is inputted, or if the enhanced data packet that does not include the initialization data place holder that is to be replaced, the parity byte replacer 925 selects the data and RS parity outputted from the data interleaver 924 and directly outputs the selected data to the trellis encoding module 927 without modification. The trellis encoding module 927 converts the byte-unit data to symbol-unit data and 12-way interleaves and trellis-encodes the converted data, which are then outputted to the frame multiplexer 928. The frame multiplexer 928 inserts field synchronization and segment synchronization signals in the output of the trellis encoding module 927 and then outputs the processed data to the transmitting unit 930. Herein, the transmitting unit 930 includes a pilot inserter 931, a modulator 932, and a radio frequency (RF) up-converter 933. The operation of the transmitting unit 930 is identical to the conventional transmitters. Therefore, a detailed description of the same will be omitted for simplicity.

Figure 14:
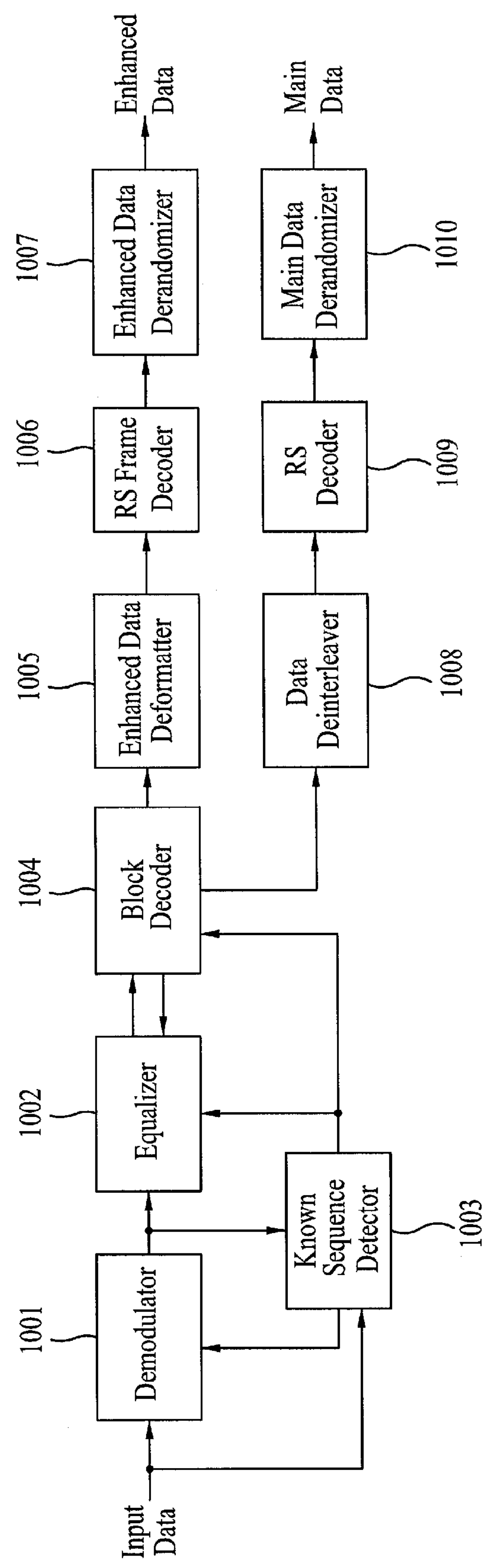
FIG. 14 illustrates a block diagram showing a general structure of a demodulating unit within a digital broadcast (or television or DTV) receiving system according to another embodiment of the present invention.

FIG. 14 illustrates a block diagram of a demodulating unit included in the receiving system according to another embodiment of the present invention. Herein, the demodulating unit may effectively process signals transmitted from the transmitting system shown in FIG. 11. Referring to FIG. 14, the demodulating unit includes a demodulator 1001, a channel equalizer 1002, a known data detector 1003, a block decoder 1004, an enhanced data deformatter 1005, a RS frame decoder 1006, an enhanced data derandomizer 1007, a data deinterleaver 1008, a RS decoder 1009, and a main data derandomizer 1010. For simplicity, the demodulator 1001, the channel equalizer 1002, the known data detector 1003, the block decoder 1004, the enhanced data deformatter 1005, the RS frame decoder 1006, and the enhanced data derandomizer 1007 will be referred to as an enhanced data processor. And, the data deinterleaver 1008, the RS decoder 1009, and the main data derandomizer 1010 will be referred to as a main data processor.

More specifically, the enhanced data including known data and the main data are received through the tuner and inputted to the demodulator 1001 and the known data detector 1003. The demodulator 1001 performs automatic gain control, carrier wave recovery, and timing recovery on the data that are being inputted, thereby creating baseband data, which are then outputted to the equalizer 1002 and the known data detector 1003. The equalizer 1002 compensates the distortion within the channel included in the demodulated data. Then, the equalizer 1002 outputs the compensated data to the block decoder 1004.

At this point, the known data detector 1003 detects the known data place inserted by the transmitting system to the input/output data of the demodulator 1001 (i.e., data prior to demodulation or data after demodulation). Then, along with the position information, the known data detector 1003 outputs the symbol sequence of the known data generated from the corresponding position to the demodulator 1001 and the equalizer 1002. Additionally, the known data detector 1003 outputs information enabling the block decoder 1004 to identify the enhanced data being additionally encoded by the transmitting system and the main data that are not additionally encoded to the block decoder 1004. Furthermore, although the connection is not shown in FIG. 14, the information detected by the known data detector 1003 may be used in the overall receiving system and may also be used in the enhanced data formatter 1005 and the RS frame decoder 1006.

By using the known data symbol sequence when performing the timing recovery or carrier wave recovery, the demodulating performance of the demodulator 1001 may be enhanced. Similarly, by using the known data, the channel equalizing performance of the channel equalizer 1002 may be enhanced. Furthermore, by feeding-back the decoding result of the block decoder 1004 to the channel equalizer 1002, the channel equalizing performance may also be enhanced.

The channel equalizer 1002 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 12. More specifically, in the example of the present invention, each region A, B, and C are further divided into regions A1 to A5, regions B1 and B2, and regions C1 to C3, respectively. Referring to FIG. 12, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being channel equalized and then inputted to the block decoder 1004 correspond to the enhanced data on which additional encoding and trellis encoding are both performed by the transmitting system, trellis-decoding and additional decoding processes are performed as reverse processes of the transmitting system. Alternatively, if the data being channel equalized and then inputted to the block decoder 1004 correspond to the main data on which additional encoding is not performed and only trellis-encoding is performed by the transmitting system, only the trellis-decoding process is performed. The data group decoded by the block decoder 1004 is inputted to the enhanced data deformatter 1005, and the main data packet is inputted to the data deinterleaver 1008.

More specifically, if the inputted data correspond to the main data, the block decoder 1004 performs Viterbi decoding on the inputted data, so as to either output a hard decision value or hard-decide a soft decision value and output the hard-decided result. On the other hand, if the inputted correspond to the enhanced data, the block decoder 1004 outputs either a hard decision value or a soft decision value on the inputted enhanced data. In other words, if the data inputted to the block decoder 1004 correspond to the enhanced data, the block decoder 1004 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 1004 may output a hard decision value on the enhanced data. However, when required, it is more preferable that the block decoder 1004 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 1008, the RS decoder 1009, and the main data derandomizer 1010 are blocks required for receiving the main data. These blocks may not be required in a receiving system structure that receives only the enhanced data. The data deinterleaver 1008 performs an reverse process of the data interleaver of the transmitting system. More specifically, the data deinterleaver 1008 deinterleaver the main data being outputted from the block decode 1004 and outputs the deinterleaved data to the RS decoder 1009. The RS decoder 1009 performs systematic RS decoding on the deinterleaved data and outputs the systematically decoded data to the main data derandomizer 1010. The main data derandomizer 1010 receives the data outputted from the RS decoder 1009 so as to generate the same pseudo random byte as that of the randomizer in the transmitting system. The main data derandomizer 1010 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 1005 from the block decoder 1004 is a data group format. At this point, the enhanced data deformatter 1005 already knows the structure of the input data. Therefore, the enhanced data deformatter 1005 identifies the system information including signaling information and the enhanced data from the data group. Thereafter, the identified signaling information is transmitted to where the system information is required, and the enhanced data are outputted to the RS frame decoder 1006. The enhanced data deformatter 1005 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 1006.

More specifically, the RS frame decoder 1006 receives the RS-coded and CRC-coded enhanced data from the enhanced data deformatter 1005 so as to configure the RS frame. The RS frame decoder 1006 performs an reverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 1007. Herein, the enhanced data derandomizer 1007 performs a derandomizing process, which corresponds to an reverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 1006 may also be configured as follows. The RS frame decoder 1006 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 1006 compares the absolute value of the soft decision value obtained from the block decoder 1004 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 15:
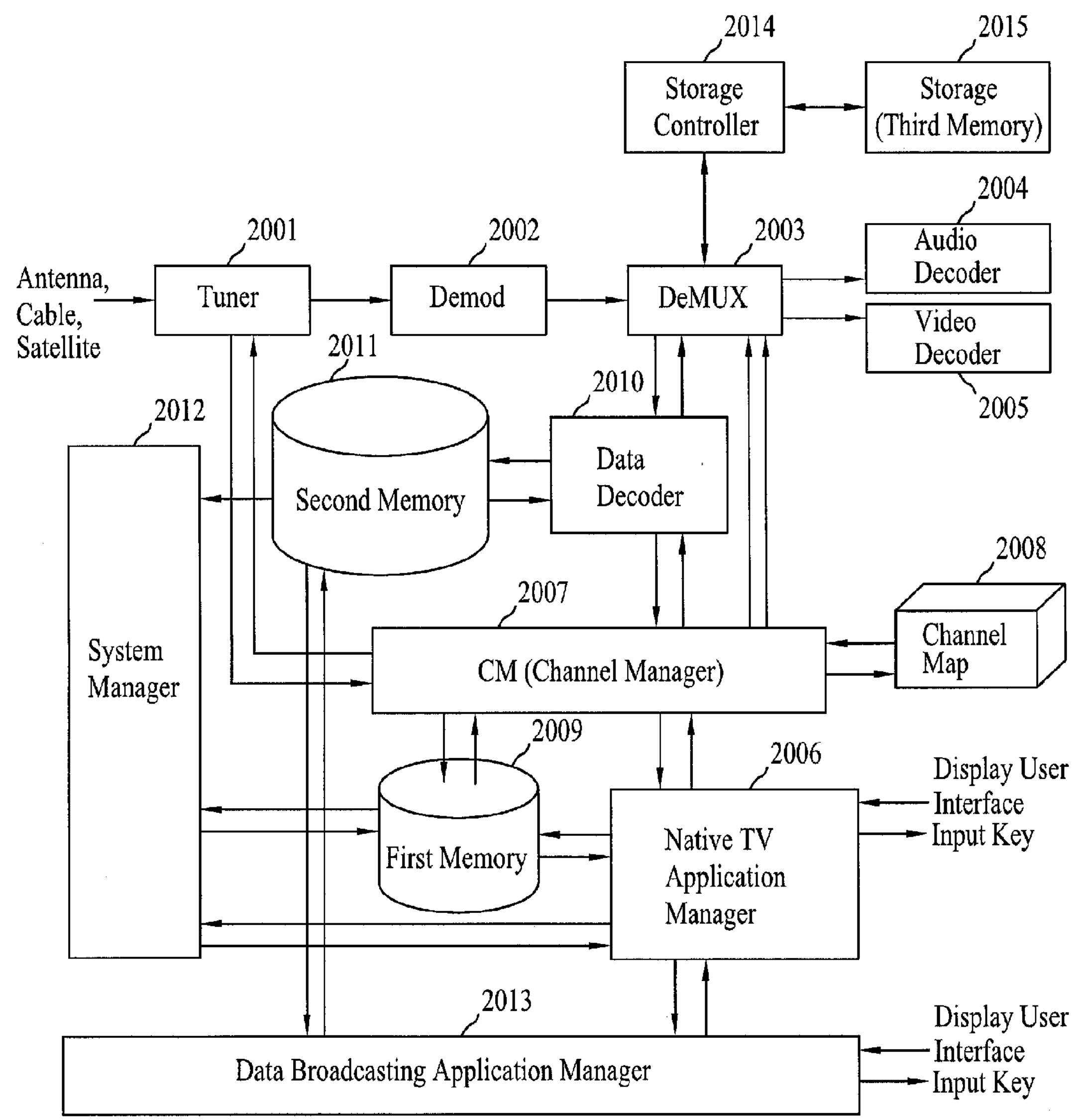
FIG. 15 illustrates a block diagram showing the structure of a digital broadcast (or television or DTV) receiving system according to an embodiment of the present invention.

FIG. 15 illustrates a block diagram showing the structure of a digital broadcast receiving system according to an embodiment of the present invention. Referring to FIG. 15, the digital broadcast receiving system includes a tuner 2001, a demodulating unit 2002, a demultiplexer 2003, an audio decoder 2004, a video decoder 2005, a native TV application manager 2006, a channel manager 2007, a channel map 2008, a first memory 2009, a data decoder 2010, a second memory 2011, a system manager 2012, a data broadcasting application manager 2013, a storage controller 2014, and a third memory 2015. Herein, the third memory 2015 is a mass storage device, such as a hard disk drive (HDD) or a memory chip. The tuner 2001 tunes a frequency of a specific channel through any one of an antenna, cable, and satellite. Then, the tuner 2001 down-converts the tuned frequency to an intermediate frequency (IF), which is then outputted to the demodulating unit 2002. At this point, the tuner 2001 is controlled by the channel manager 2007. Additionally, the result and strength of the broadcast signal of the tuned channel are also reported to the channel manager 2007. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 2002 performs demodulation and channel equalization on the signal being outputted from the tuner 2001, thereby identifying the main data and the enhanced data. Thereafter, the identified main data and enhanced data are outputted in TS packet units. Examples of the demodulating unit 2002 are shown in FIG. 8 and FIG. 14. The demodulating unit shown in FIG. 8 and FIG. 14 is merely exemplary and the scope of the present invention is not limited to the examples set forth herein. In the embodiment given as an example of the present invention, only the enhanced data packet outputted from the demodulating unit 2002 is inputted to the demultiplexer 2003. In this case, the main data packet is inputted to another demultiplexer (not shown) that processes main data packets. Herein, the storage controller 2014 is also connected to the other demultiplexer in order to store the main data after processing the main data packets. The demultiplexer of the present invention may also be designed to process both enhanced data packets and main data packets in a single demultiplexer.

The storage controller 2014 is interfaced with the demultipelxer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 15, the corresponding enhanced data and/or main data that are inputted to the demultiplexer are stored in the third memory 2015 in accordance with the control of the storage controller 2014. The third memory 2015 may be described as a temporary storage area and/or a permanent storage area. Herein, the temporary storage area is used for the time shifting function, and the permanent storage area is used for a permanent storage of data according to the user's choice (or decision).

When the data stored in the third memory 2015 need to be reproduced (or played), the storage controller 2014 reads the corresponding data stored in the third memory 2015 and outputs the read data to the corresponding demultiplexer (e.g., the enhanced data are outputted to the demultiplexer 2003 shown in FIG. 15). At this point, according to the embodiment of the present invention, since the storage capacity of the third memory 2015 is limited, the compression encoded enhanced data and/or main data that are being inputted are directly stored in the third memory 2015 without any modification for the efficiency of the storage capacity. In this case, depending upon the reproduction (or reading) command, the data read from the third memory 2015 pass trough the demultiplexer so as to be inputted to the corresponding decoder, thereby being restored to the initial state.

The storage controller 2014 may control the reproduction (or play), fast-forward, rewind, slow motion, instant replay functions of the data that are already stored in the third memory 2015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 2014 compression encodes the inputted data and stored the compression-encoded data to the third memory 2015. In order to do so, the storage controller 2014 may include an encoder, wherein the encoder may be embodied as one of software, middleware, and hardware. Herein, an MPEG encoder may be used as the encoder according to an embodiment of the present invention. The encoder may also be provided outside of the storage controller 2014.

Meanwhile, in order to prevent illegal duplication (or copies) of the input data being stored in the third memory 2015, the storage controller 2014 scrambles the input data and stores the scrambled data in the third memory 2015. Accordingly, the storage controller 2014 may include a scramble algorithm for scrambling the data stored in the third memory 2015 and a descramble algorithm for descrambling the data read from the third memory 2015. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 2003 receives the real-time data outputted from the demodulating unit 2002 or the data read from the third memory 2015 and demultiplexes the received data. In the example given in the present invention, the demultiplexer 2003 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 2003 and the subsequent elements.

The demultiplexer 2003 demultiplexes enhanced data and program specific information/program and system information protocol (PSI/PSIP) tables from the enhanced data packet inputted in accordance with the control of the data decoder 2010. Thereafter, the demultiplexed enhanced data and PSI/PSIP tables are outputted to the data decoder 2010 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 2010, the demultiplexer 2003 performs section filtering, thereby discarding repetitive sections and outputting only the non-repetitive sections to the data decoder 2010. The demultiplexer 2003 may also output only the sections configuring desired tables (e.g., VCT) to the data decoder 2010 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 2003 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 2003 may output only an application information table (AIT) to the data decoder 2010 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 2011 by the data decoder 2010.

The data decoder 2010 parses the DSM-CC section configuring the demultiplexed enhanced data. Then, the enhanced data corresponding to the parsed result are stored as a database in the second memory 2011. The data decoder 2010 groups a plurality of sections having the same table identification (table_id) so as to configure a table, which is then parsed. Thereafter, the parsed result is stored as a database in the second memory 2011. At this point, by parsing data and/or sections, the data decoder 2010 reads all of the remaining actual section data that are not section-filtered by the demultiplexer 2003. Then, the data decoder 2010 stores the read data to the second memory 2011. The second memory 2011 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 2011 or be outputted to the data broadcasting application manager 2013. In addition, reference may be made to the application identification information, service component identification information, and service information in order to decode the data service data. Alternatively, such information may also prepare the operation of the application program for the data service. Furthermore, the data decoder 2010 controls the demultiplexing of the system information table, which corresponds to the information table associated with the channel and events. Thereafter, an A.V PID list may be transmitted to the channel manager 2007.

The channel manager 2007 may refer to the channel map 2008 in order to transmit a request for receiving system-related information data to the data decoder 2010, thereby receiving the corresponding result. In addition, the channel manager 2007 may also control the channel tuning of the tuner 2001. Furthermore, the channel manager 2007 may directly control the demultiplexer 2003, so as to set up the A/V PID, thereby controlling the audio decoder 2004 and the video decoder 2005. The audio decoder 2004 and the video decoder 2005 may respectively decode and output the audio data and video data demultiplexed from the main data packet. Alternatively, the audio decoder 2004 and the video decoder 2005 may respectively decode and output the audio data and video data demultiplexed from the enhanced data packet. Meanwhile, when the enhanced data include data service data, and also audio data and video data, it is apparent that the audio data and video data demultiplexed by the demultiplexer 2003 are respectively decoded by the audio decoder 2004 and the video decoder 2005. For example, an audio-coding (AC)-3 decoding algorithm may be applied to the audio decoder 2004, and a MPEG-2 decoding algorithm may be applied to the video decoder 2005.

Meanwhile, the native TV application manager 2006 operates a native application program stored in the first memory 2009, thereby performing general functions such as channel change. The native application program refers to software stored in the receiving system upon shipping of the product. More specifically, when a user request (or command) is transmitted to the receiving system through a user interface (UI), the native TV application manger 2006 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 2006 and the data broadcasting application manager 2013. Furthermore, the native TV application manager 2006 controls the channel manager 2007, thereby controlling channel-associated, such as the management of the channel map 2008, and controlling the data decoder 2010. The native TV application manager 2006 also controls the GUI of the overall receiving system, thereby storing the user request and status of the receiving system in the first memory 2009 and restoring the stored information.

The channel manager 2007 controls the tuner 2001 and the data decoder 2010, so as to managing the channel map 2008 so that it can respond to the channel request made by the user. More specifically, channel manager 2007 sends a request to the data decoder 2010 so that the tables associated with the channels that are to be tuned are parsed. The results of the parsed tables are reported to the channel manager 2007 by the data decoder 2010. Thereafter, based on the parsed results, the channel manager 2007 updates the channel map 2008 and sets up a PID in the demultiplexer 2003 for demultiplexing the tables associated with the data service data from the enhanced data.

The system manager 2012 controls the booting of the receiving system by turning the power on or off. Then, the system manager 2012 stores ROM images (including downloaded software images) in the first memory 2009. More specifically, the first memory 2009 stores management programs such as operating system (OS) programs required for managing the receiving system and also application program executing data service functions. The application program is a program processing the data service data stored in the second memory 2011 so as to provide the user with the data service. If the data service data are stored in the second memory 2011, the corresponding data service data are processed by the above-described application program or by other application programs, thereby being provided to the user. The management program and application program stored in the first memory 2009 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 2009 upon the shipping of the receiving system, or be stored in the first 2009 after being downloaded. The application program for the data service (i.e., the data service providing application program) stored in the first memory 2009 may also be deleted, updated, and corrected. Furthermore, the data service providing application program may be downloaded and executed along with the data service data each time the data service data are being received.

When a data service request is transmitted through the user interface, the data broadcasting application manager 2013 operates the corresponding application program stored in the first memory 2009 so as to process the requested data, thereby providing the user with the requested data service. And, in order to provide such data service, the data broadcasting application manager 2013 supports the graphic user interface (GUI). Herein, the data service may be provided in the form of text (or short message service (SMS)), voice message, still image, and moving image. The data broadcasting application manager 2013 may be provided with a platform for executing the application program stored in the first memory 2009. The platform may be, for example, a Java virtual machine for executing the Java program. Hereinafter, an example of the data broadcasting application manager 2013 executing the data service providing application program stored in the first memory 2009, so as to process the data service data stored in the second memory 2011, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 15, the GPS module receives satellite signals transmitted from a plurality of low earth orbit satellites and extracts the current position (or location) information (e.g., longitude, latitude, altitude), thereby outputting the extracted information to the data broadcasting application manager 2013.

At this point, it is assumed that the electronic map including information on each link and nod and other diverse graphic information are stored in one of the second memory 2011, the first memory 2009, and another memory that is not shown. More specifically, according to the request made by the data broadcasting application manager 2013, the data service data stored in the second memory 2011 are read and inputted to the data broadcasting application manager 2013. The data broadcasting application manager 2013 translates (or deciphers) the data service data read from the second memory 2011, thereby extracting the necessary information according to the contents of the message and/or a control signal.

Figure 16:
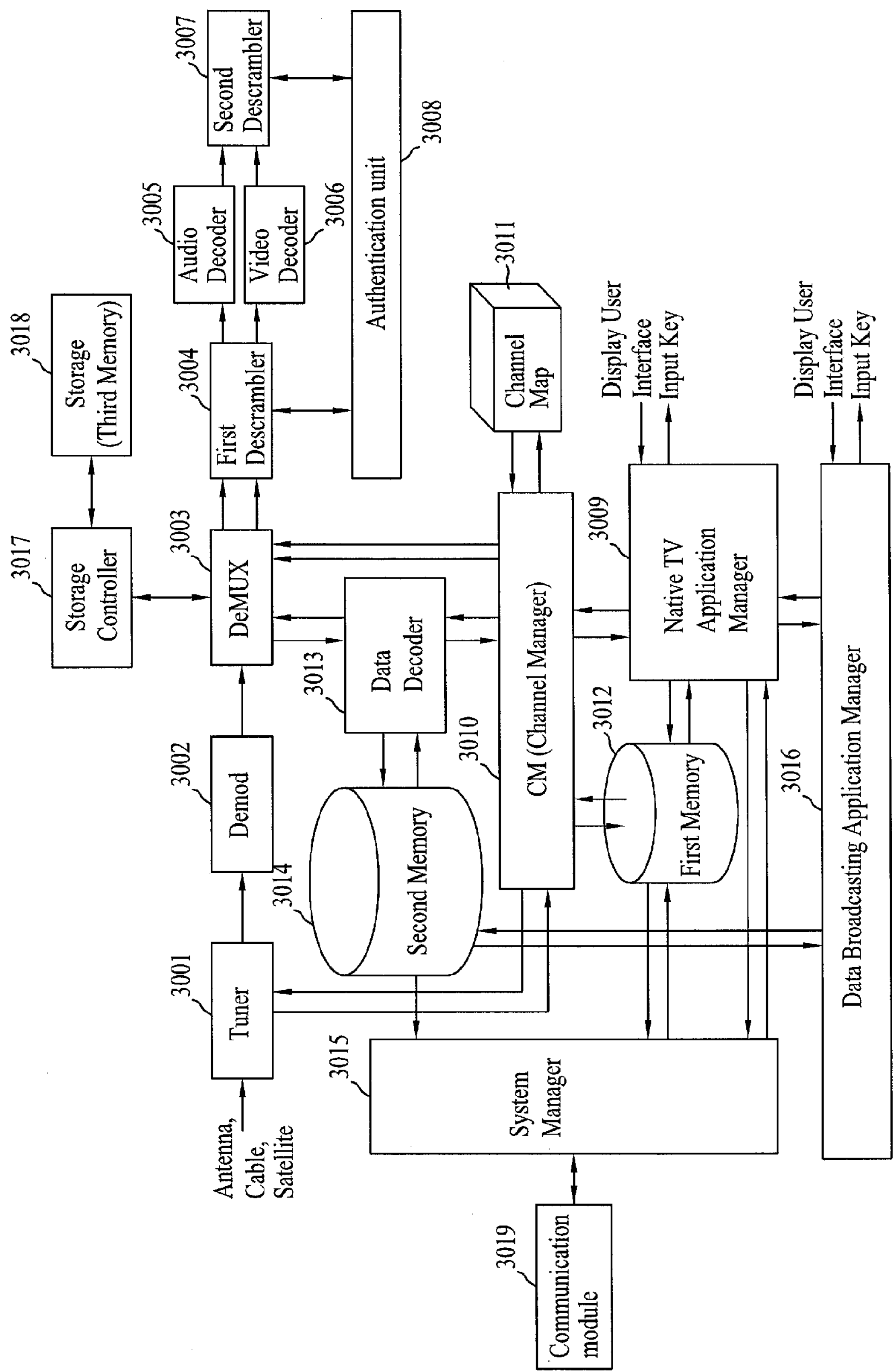
FIG. 16 illustrates a block diagram showing the structure of a digital broadcast (or television or DTV) receiving system according to another embodiment of the present invention.

FIG. 16 illustrates a block diagram showing the structure of a digital broadcast (or television) receiving system according to another embodiment of the present invention. Referring to FIG. 16, the digital broadcast receiving system includes a tuner 3001, a demodulating unit 3002, a demultiplexer 3003, a first descrambler 3004, an audio decoder 3005, a video decoder 3006, a second descrambler 3007, an authentication unit 3008, a native TV application manager 3009, a channel manager 3010, a channel map 3011, a first memory 3012, a data decoder 3013, a second memory 3014, a system manager 3015, a data broadcasting application manager 3016, a storage controller 3017, a third memory 3018, and a telecommunication module 3019. Herein, the third memory 3018 is a mass storage device, such as a hard disk drive (HDD) or a memory chip. Also, during the description of the digital broadcast (or television or DTV) receiving system shown in FIG. 16, the components that are identical to those of the digital broadcast receiving system of FIG. 15 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 3004 and 3007, and the authentication means will be referred to as an authentication unit 3008. Such naming of the corresponding components is merely exemplary and is not limited to the terms suggested in the description of the present invention. For example, the units may also be referred to as a decryptor. Although FIG. 16 illustrates an example of the descramblers 3004 and 3007 and the authentication unit 3008 being provided inside the receiving system, each of the descramblers 3004 and 3007 and the authentication unit 3008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 3008, the scrambled broadcasting contents are descrambled by the descramblers 3004 and 3007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 3008 and the descramblers 3004 and 3007 will now be described in detail. The receiving system receives the scrambled broadcasting contents through the tuner 3001 and the demodulating unit 3002. Then, the system manager 3015 decides whether the received broadcasting contents have been scrambled. Herein, the demodulating unit 3002 may be included as a demodulating means according to embodiments of the present invention as described in FIG. 8 and FIG. 14. However, the present invention is not limited to the examples given in the description set forth herein. If the system manager 3015 decides that the received broadcasting contents have been scrambled, then the system manager 3015 controls the system to operate the authentication unit 3008. As described above, the authentication unit 3008 performs an authentication process in order to decide whether the receiving system according to the present invention corresponds to a legitimate host entitled to receive the paid broadcasting service. Herein, the authentication process may vary in accordance with the authentication methods.

For example, the authentication unit 3008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 3008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 3008 performs the authentication process by determining the conformity between the address of the corresponding receiving system and the system information of the receiving system that is mapped with the IP address. In other words, if the authentication unit 3008 determines that the two types of information conform to one another, then the authentication unit 3008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 3008 of the receiving system extracts the identification information of the receiving system and the identification information included in the EMM of the broadcasting service that is being received. Then, the authentication unit 3008 determines whether the identification information conform to each other, so as to perform the authentication process. More specifically, if the authentication unit 3008 determines that the information conform to each other, then the authentication unit 3008 eventually determines that the receiving system is entitled to receive the request broadcasting service.

In yet another example, the authentication unit 3008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 3015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 3015 transmits the payment information to the remote transmitting system through the telecommunication module 3019.

The authentication unit 3008 authenticates the corresponding receiving system and/or the external module. Then, if the authentication process is successfully completed, the authentication unit 3008 certifies the corresponding receiving system and/or the external module as a legitimate system and/or module entitled to receive the requested paid broadcasting service. In addition, the authentication unit 3008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 3008, the receiving system may descramble the scrambled broadcasting contents received from the transmitting system. At this point, the descrambling process is performed by the first and second descramblers 3004 and 3007. Herein, the first and second descramblers 3004 and 3007 may be included in an internal module or an external module of the receiving system.

The receiving system is also provided with a common interface for communicating with the external module including the first and second descramblers 3004 and 3007, so as to perform the descrambling process. More specifically, the first and second descramblers 3004 and 3007 may be included in the module or in the receiving system in the form of hardware, middleware or software. Herein, the descramblers 3004 and 3007 may be included in any one of or both of the module and the receiving system. If the first and second descramblers 3004 and 3007 are provided inside the receiving system, it is advantageous to have the transmitting system (i.e., at least any one of a service provider and a broadcast station) scramble the corresponding data using the same scrambling method.

Alternatively, if the first and second descramblers 3004 and 3007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 3015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 3012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 3008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 3008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 3015, then the memory card is verified and determined to be a normal memory card that may be used in the receiving system. At this point, the CAS software may either be installed in the first memory 3012 upon the shipping of the present invention, or be downloaded to the first memory 3012 from the transmitting system or the module or memory card, as described above. Herein, the descrambling function may be operated by the data broadcasting application manger 3016 as an application program.

Thereafter, the CAS software parses the EMM/ECM packets outputted from the demultiplexer 3003, so as to verify whether the receiving system is entitled to receive the corresponding data, thereby obtaining the information required for descrambling (i.e., the CW) and providing the obtained CW to the descramblers 3004 and 3007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 3004 and 3007. Each of the descramblers 3004 and 3007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 3004 and 3007 may be included in the module either in the form of hardware or in the form of software. In this case, the scrambled data that being received are descrambled by the module and then demodulated. Also, if the scrambled data that are being received are stored in the third memory 3018, the received data may be descrambled and then stored, or stored in the memory at the point of being received and then descrambled later on prior to being played (or reproduced). Thereafter, in case scramble/descramble algorithms are provided in the storage controller 3017, the storage controller 3017 scrambles the data that are being received once again and then stores the re-scrambled data to the third memory 3018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 3019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 3019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 3019 may also be configured. Also, the PDU may be configured in the Java application of the receiving system and then outputted to the telecommunication module 3019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 3019.

The broadcasting data being transmitted and received through the above-described wireless data network may include data required for performing the function of limiting data reception. Meanwhile, the demultiplexer 3003 receives either the real-time data outputted from the demodulating unit 3002 or the data read from the third memory 3018, thereby performing demultiplexing. In this embodiment of the present invention, the demultiplexer 3003 performs demultiplexing on the enhanced data packet. Similar process steps have already been described earlier in the description of the present invention. Therefore, a detailed of the process of demultiplexing the enhanced data will be omitted for simplicity.

The first descrambler 3004 receives the demultiplexed signals from the demultiplexer 3003 and then descrambles the received signals. At this point, the first descrambler 3004 may receive the authentication result received from the authentication unit 3008 and other data required for the descrambling process, so as to perform the descrambling process. The audio decoder 3005 and the video decoder 3006 receive the signals descrambled by the first descrambler 3004, which are then decoded and outputted. Alternatively, if the first descrambler 3004 did not perform the descrambling process, then the audio decoder 3005 and the video decoder 3006 directly decode and output the received signals. In this case, the decoded signals are received and then descrambled by the second descrambler 3007 and processed accordingly.

As described above, the DTV transmitting system and receiving system and method of processing broadcast data according to the present invention have the following advantages. More specifically, the present invention is highly protected against (or resistant to) any error that may occur when transmitting supplemental data through a channel. And, the present invention is also highly compatible to the conventional receiving system. Moreover, the present invention may also receive the supplemental data without any error even in channels having severe ghost effect and noise.

Additionally, by performing a double error correction decoding process and a row permutation process on the enhanced data, robustness is provided to the enhanced data, thereby enabling the enhanced data to respond adequately and strongly against the fast and frequent change in channels. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) receiving system for processing digital broadcast data, the DTV receiving system comprising:

a tuner for receiving a broadcast signal comprising at least one data group, each of the at least one data group including a first data region and a second data region, wherein the first data region comprises first enhanced data encoded with a first encoding rate, known data sequences and signaling information, and wherein the second data region comprises second enhanced data encoded with a second encoding rate;

a demodulator for demodulating the broadcast signal;

an equalizer for compensating channel distortion of the demodulated broadcast signal based on at least one of the known data sequences;

a first decoder for decoding the first enhanced data and the second enhanced data in the channel distortion compensated broadcast signal;

a second decoder for detecting and correcting at least one error in a Reed-Solomon (RS) frame by Cyclic Redundancy Check (CRC)-RS decoding the RS frame, wherein the RS frame comprises an RS frame payload including the decoded enhanced data, RS parity data added at bottom ends of columns of the RS frame payload and CRC checksum data added at right ends of rows of the RS frame payload having the RS parity data; and a derandomizer for derandomizing the decoded enhanced data in the error corrected RS frame.

2. The DTV receiving system of claim 1, wherein the first coding rate is either ½ or ¼.

3. The DTV receiving system of claim 1, wherein the second coding rate is either ½ or ¼.

4. The DTV receiving system of claim 1, wherein the equalizer compensates channel distortion of the first enhanced data by interpolating at least two channel impulse responses (CIRs) estimated based on at least two of the known data sequences.

5. The DTV receiving system of claim 1, wherein the equalizer compensates channel distortion of the second enhanced data by extrapolating at least two channel impulse responses (CIRs) estimated based on at least two of the known data sequences.

6. The DTV receiving system of claim 1, wherein at least two of the known data sequences have different lengths.

7. The DTV receiving system of claim 1, wherein at least two of the known data sequences are spaced 16 segments apart.

8. The DTV transmitting system of claim 1, wherein the received broadcast signal further comprises main data.

9. A method of processing broadcast data in a DTV receiving system, the method comprising:

receiving, by a tuner, a broadcast signal comprising at least one data group, each of the at least one data group including a first data region and a second data region, wherein the first data region comprises first enhanced data encoded with a first encoding rate, known data sequences and signaling information, and wherein the second data region comprises second enhanced data encoded with a second encoding rate;

demodulating, by a demodulator, the broadcast signal;

compensating, by an equalizer, channel distortion of the demodulated broadcast signal based on at least one of the known data sequences;

decoding the first enhanced data and the second enhanced data in the channel distortion compensated broadcast signal;

detecting at least one error in a Reed-Solomon (RS) frame by Cyclic Redundancy Check (CRC)-RS decoding the RS frame, wherein the RS frame comprises an RS frame payload including the decoded enhanced data, RS parity data added at bottom ends of columns of the RS frame payload and CRC checksum data added at right ends of rows of the RS frame payload having the RS parity data;

correcting the detected at least one error in the RS frame; and derandomizing the decoded enhanced data in the error corrected RS frame.

10. The method of claim 9, wherein the first coding rate is either ½ or ¼.

11. The method of claim 9, wherein the second coding rate is either ½ or ¼.

12. The method of claim 9, wherein compensating channel distortion of the demodulated broadcast signal comprises compensating channel distortion of the first enhanced data by interpolating at least two channel impulse responses (CIRs) estimated based on at least two of the known data sequences.

13. The method of claim 9, wherein compensating channel distortion of the demodulated broadcast signal comprises compensating channel distortion of the second enhanced data by extrapolating at least two channel impulse responses (CIRs) estimated based on at least two of the known data sequences.

14. The method of claim 9, wherein at least two of the known data sequences have different lengths.

15. The method of claim 9, wherein at least two of the known data sequences are spaced 16 segments apart.

16. The method of claim 9, wherein the received broadcast signal further comprises main data.

* * * * *